United States Patent
Rosmeulen

(10) Patent No.: US 7,569,882 B2
(45) Date of Patent: Aug. 4, 2009

(54) NON-VOLATILE MULTIBIT MEMORY CELL AND METHOD OF MANUFACTURING THEREOF

(75) Inventor: Maarten Rosmeulen, Leuven (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 59 days.

(21) Appl. No.: 11/019,953

(22) Filed: Dec. 21, 2004

(65) Prior Publication Data

US 2005/0162928 A1  Jul. 28, 2005

Related U.S. Application Data

(60) Provisional application No. 60/532,129, filed on Dec. 23, 2003.

(51) Int. Cl.
*H01L 29/792* (2006.01)
(52) U.S. Cl. .................. 257/321; 257/319; 257/324; 257/325; 257/314; 257/E27.102; 257/E27.103; 257/E29.129; 257/E29.309; 257/E29.319
(58) Field of Classification Search .............. 357/15; 257/312, 324, 401, E27.102, E27.103, E29.129, 257/E29.309, E29.319, E29.195, 325, 314; 365/182; 438/592, 433
See application file for complete search history.

(56) References Cited

U.S. PATENT DOCUMENTS

| 4,334,292 | A | * | 6/1982 | Kotecha | 365/185.14 |
|---|---|---|---|---|---|
| 4,998,147 | A | * | 3/1991 | Beckwith et al. | 257/270 |
| 5,739,065 | A | * | 4/1998 | Lin | 438/592 |
| 6,177,333 | B1 | * | 1/2001 | Rhodes | 438/433 |
| 6,255,166 | B1 | * | 7/2001 | Ogura et al. | 438/257 |
| 6,320,786 | B1 | | 11/2001 | Chang et al. | |
| 6,531,735 | B1 | * | 3/2003 | Kamigaki et al. | 257/324 |
| 6,580,120 | B2 | | 6/2003 | Haspeslagh | |
| 6,674,116 | B1 | * | 1/2004 | Cao | 257/312 |
| 2003/0142550 | A1 | * | 7/2003 | Kawahara et al. | 365/185.28 |
| 2004/0036128 | A1 | * | 2/2004 | Zhang et al. | 257/401 |

FOREIGN PATENT DOCUMENTS

WO   WO 01/67517 A   9/2001

* cited by examiner

*Primary Examiner*—Ngan Ngo
*Assistant Examiner*—Benjamin Tzu-Hung Liu
(74) *Attorney, Agent, or Firm*—Knobbe Martens Olson & Bear LLP

(57) ABSTRACT

One embodiment of the invention comprises a first semiconductor structure in electrical contact with a first contact region, a second semiconductor structure in electrical contact with a second contact region, the first semiconductor structure and the second semiconductor structure being in electrical contact with each-other along an interface, a modulating section configured to modulate the conductivity in at least one of the semiconductor structures, so that the conductivity varies along the interface, in such a way that if current flows across the interface, the current can flow only at a predetermined position along the interface, and substantially no current can flow at either side of the predetermined position.

57 Claims, 21 Drawing Sheets

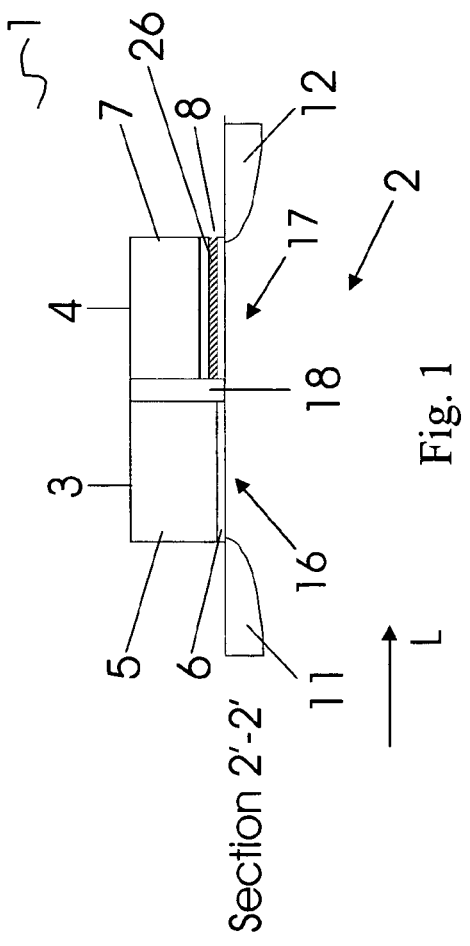
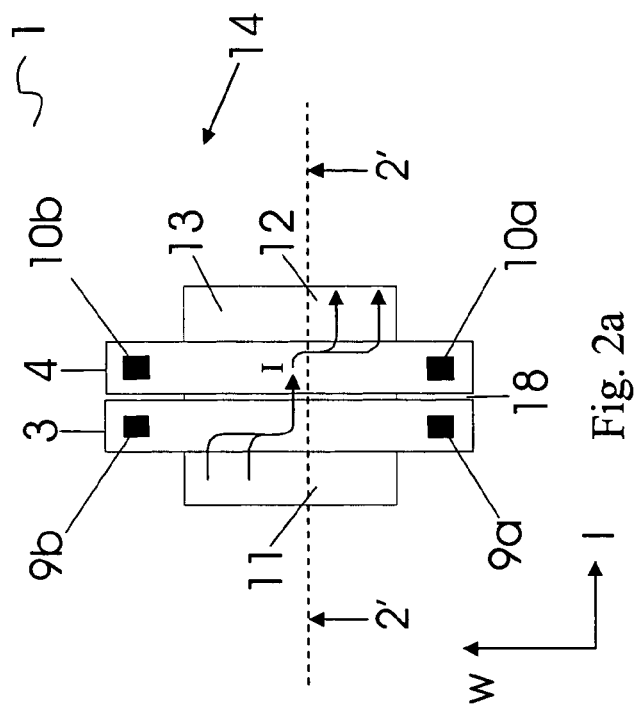
Fig. 1
Fig. 2a

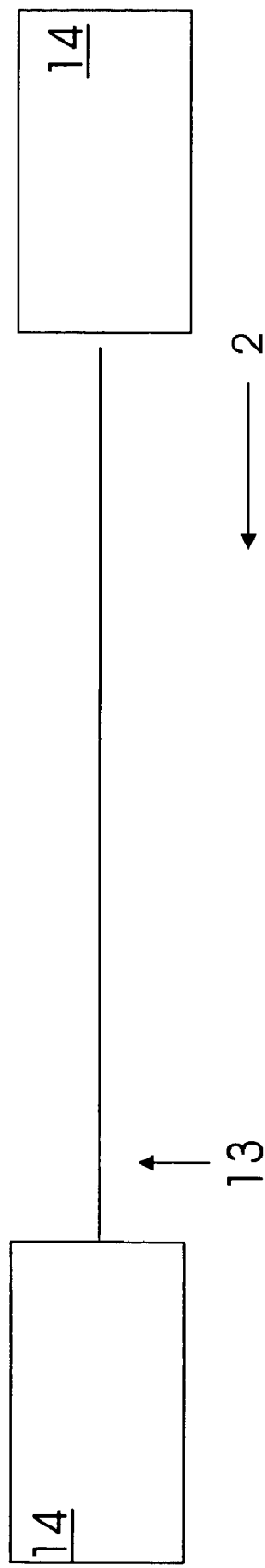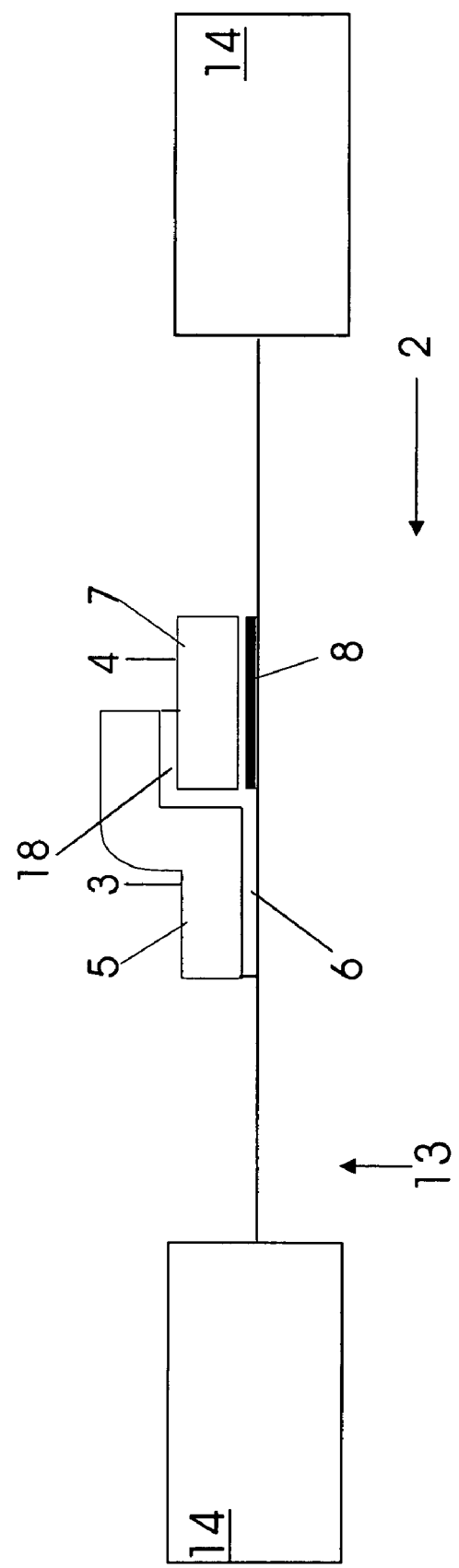
Fig. 4a
Fig. 4b

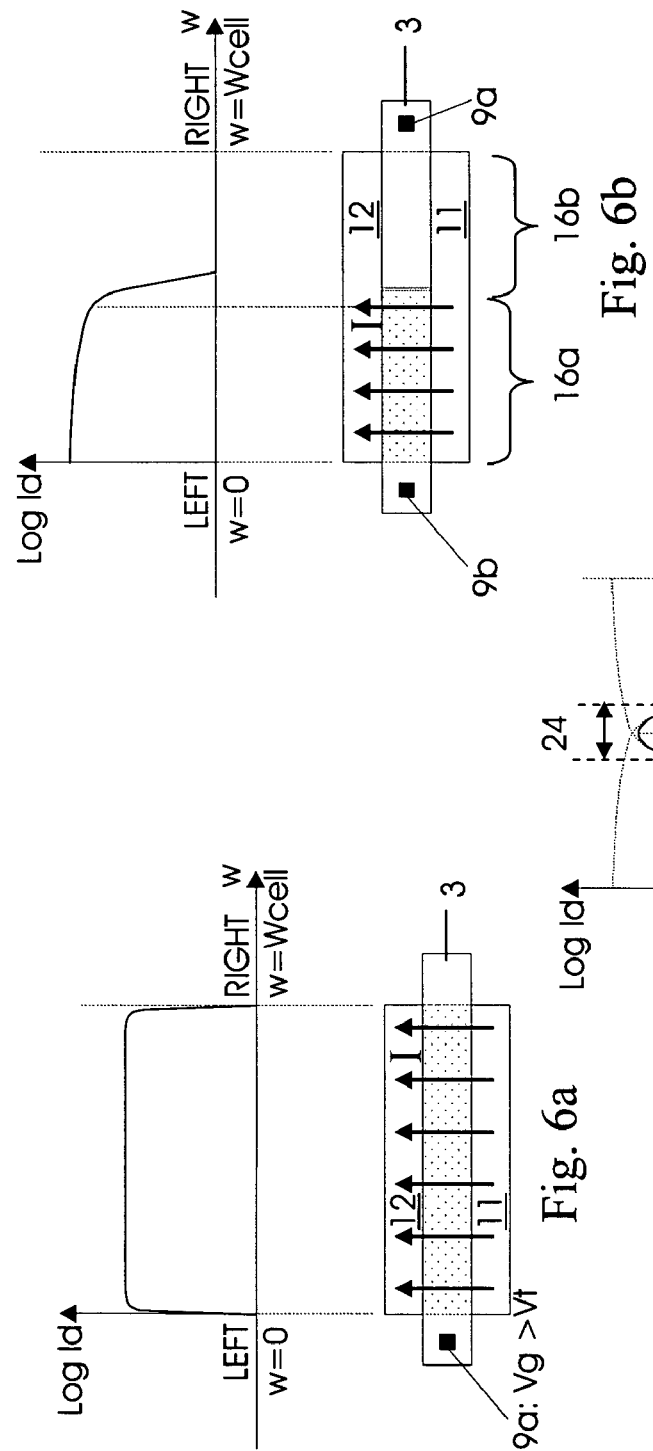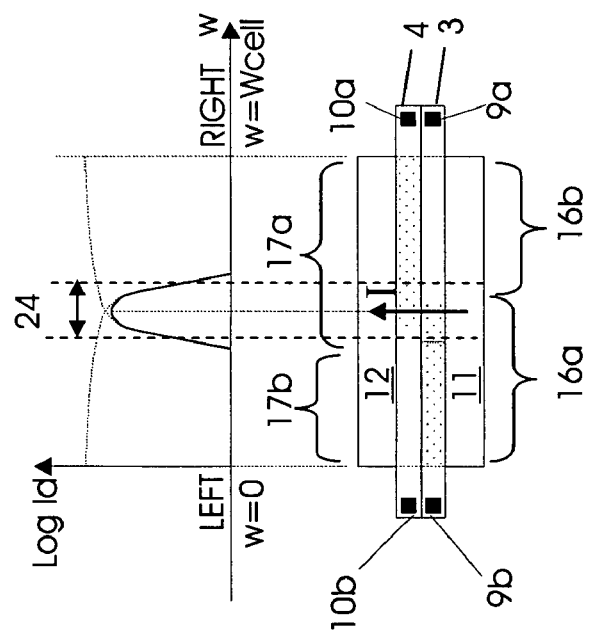
Fig. 6a
Fig. 6b
Fig. 6c

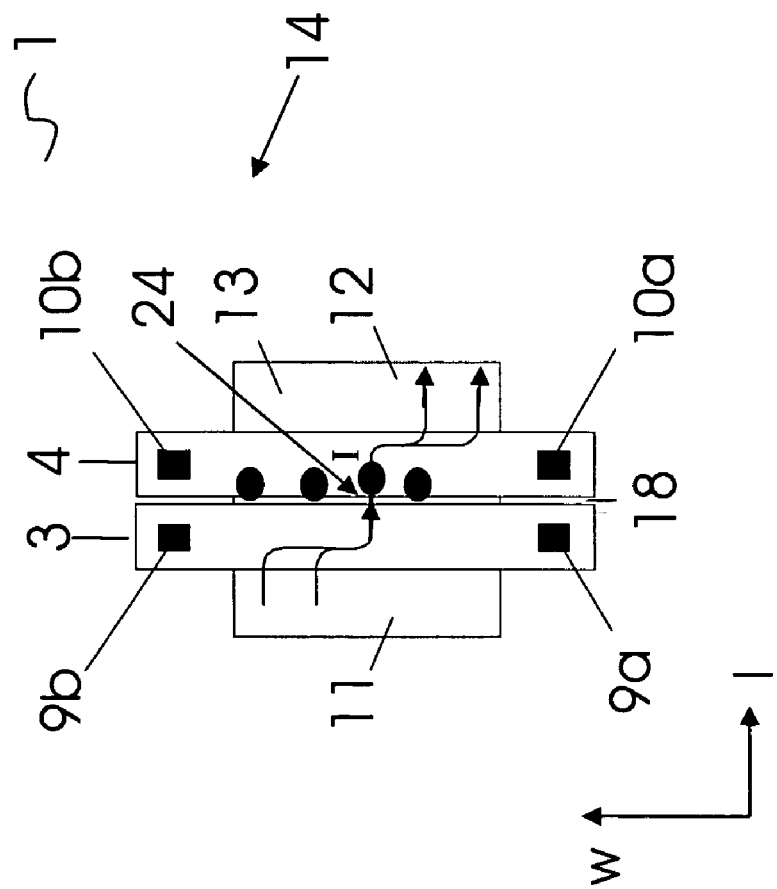
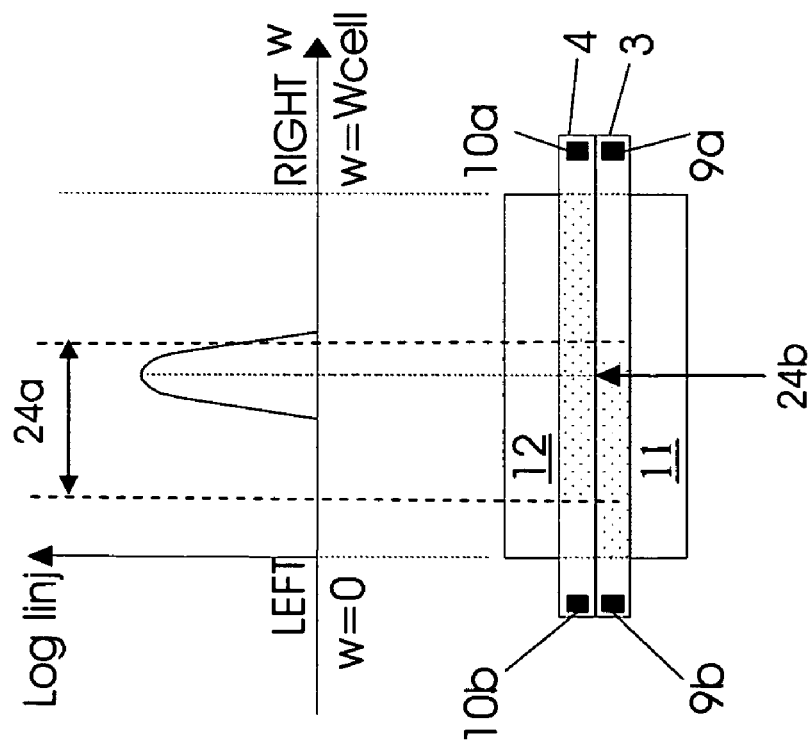
Fig. 8b
Fig. 8a

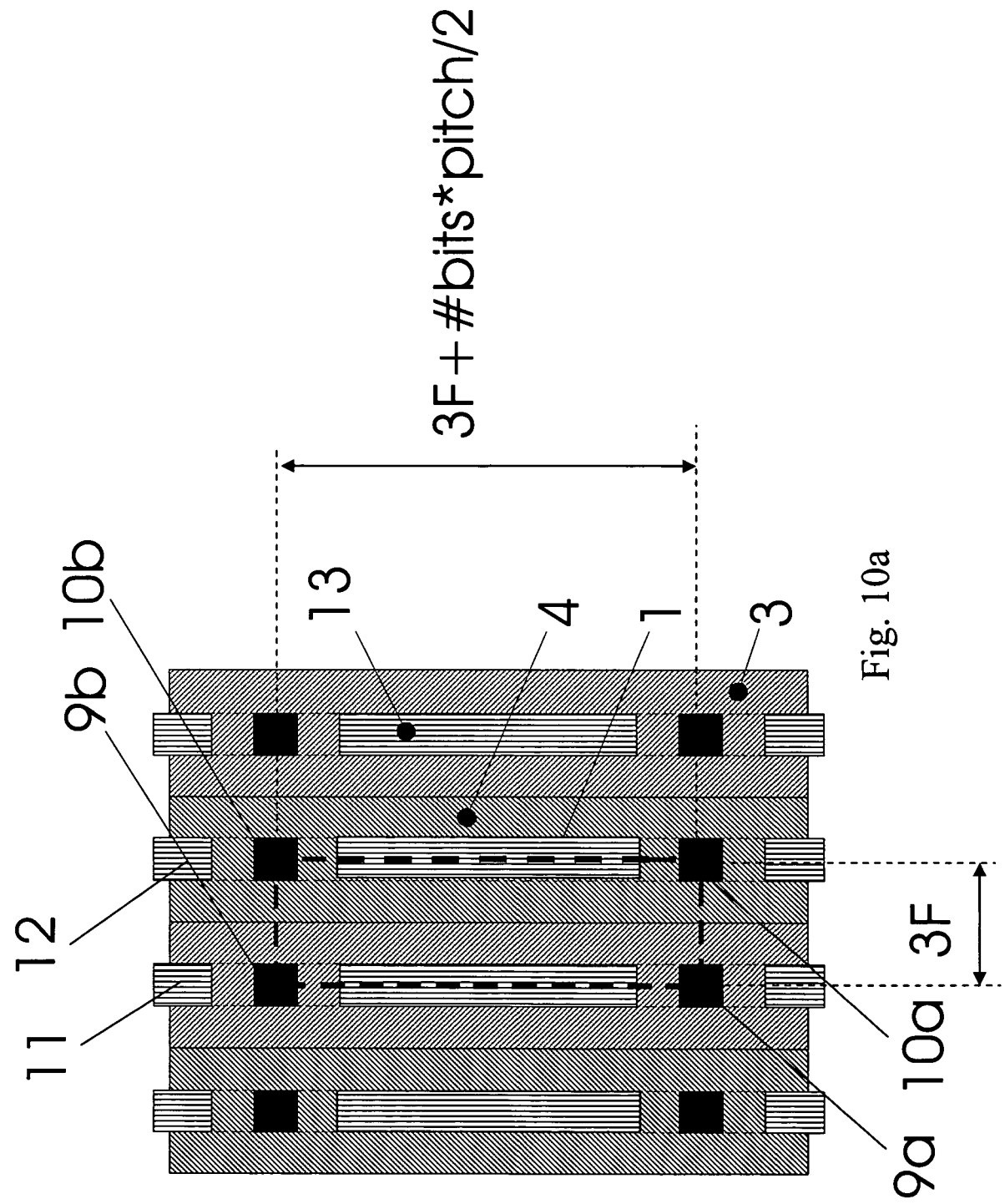

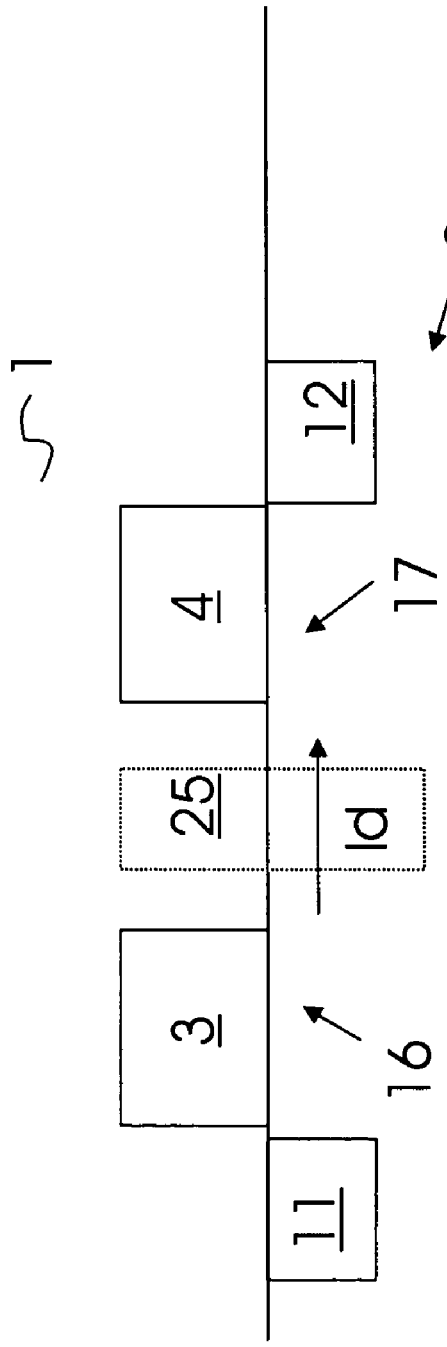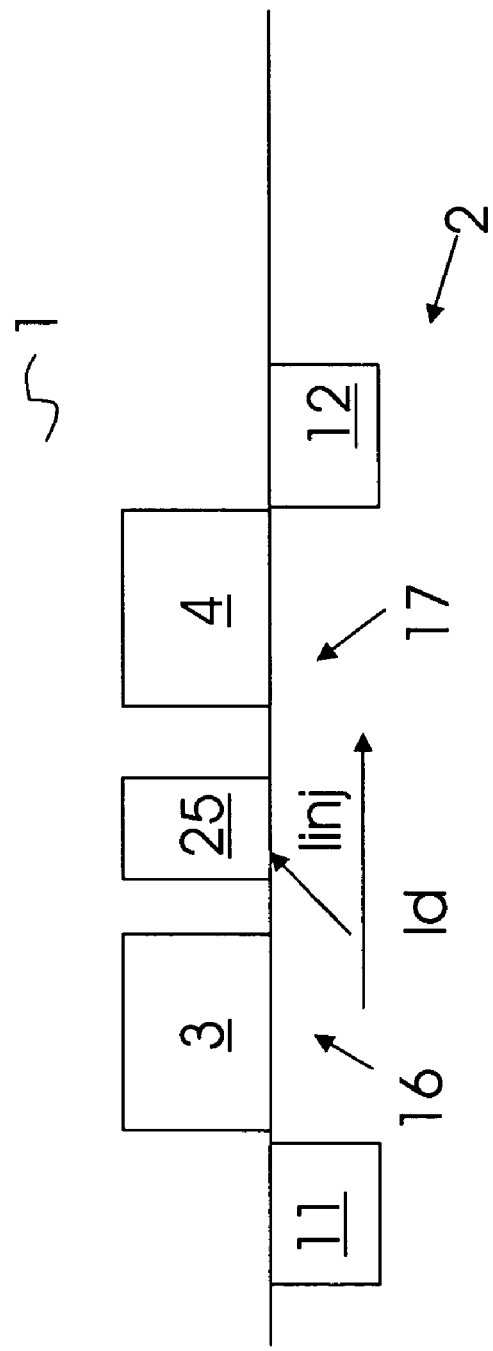

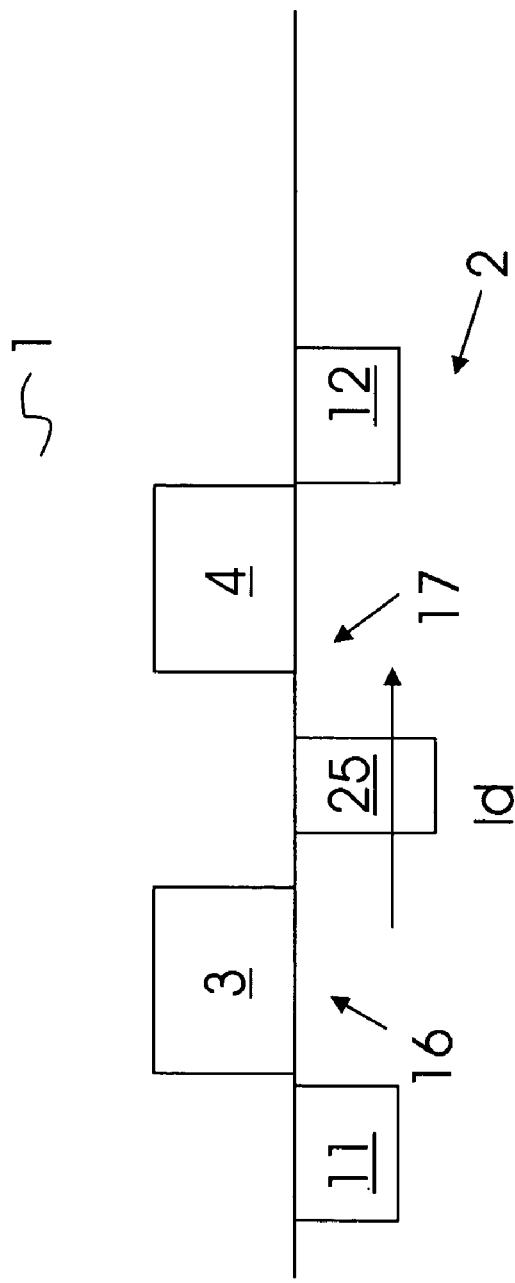
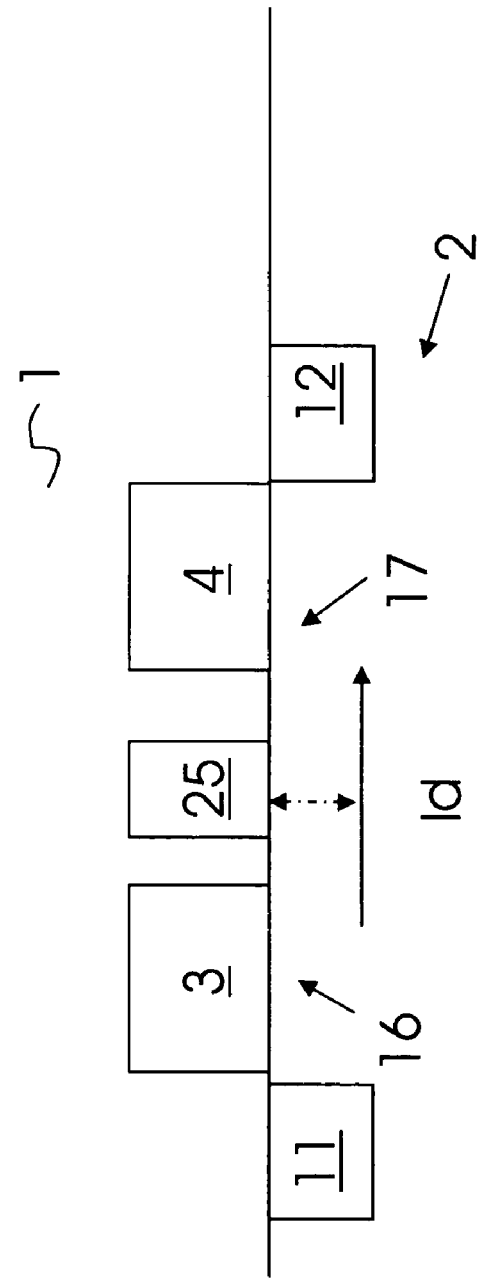

US 7,569,882 B2

NON-VOLATILE MULTIBIT MEMORY CELL AND METHOD OF MANUFACTURING THEREOF

RELATED APPLICATIONS

This application claims priority under 35 U.S.C. § 119(e) from provisional application No. 60/532,129 filed Dec. 23, 2003, which is hereby incorporated by reference.

BACKGROUND OF THE INVENTION

1. Field of the Invention

The present invention is related to dual gate devices, capable of addressing individual points along the width of the device. In particular the present invention relates to high density multibit memory cells.

2. Description of the Related Technology

The majority of the current electronic appliances require non-volatile memories, capable of preserving stored information when the power supply is switched off. One of the most versatile classes of such non-volatile memories are flash memories, in which a single cell can be addressed and data stored upon, while a large number of cells can be electrically erased at the same time. Flash memories are widely used e.g. to store the basic input-output system (BIOS) of personal computers, the software and personal data of cellular phones, identification codes in smart cards and many other applications. Flash memories allow software updates, change of passwords and codes, and reconfiguration of the system in the field. They can be designed and optimized to create high-density data storage memories that can e.g. successfully substitute hard disks for specific applications, having lower power consumption and weight, shorter access times, and far better robustness. A flash memory cell typically comprises a charge storage layer, in which a bit in the form of a dedicated amount of charge can be stored and whereby this charge influences the current flow in a channel region under control of this charge storage layer, a program gate to bias the memory cell e.g. such that this charge is transported into the charge storage layer during programming and out of the charge storage layer during erasing, and a control gate to assist, during operation, in selecting the desired memory cell from a matrix of memory cells. The charge storage layer can be of a conductive material, such as polysilicon, surrounded by dielectric layers or can be of a non-conductive material such as nitride, e.g. silicon-nitride.

Manufacturers of flash memories are forced to increase the performance of the memories in terms of, e.g., density, speed, power consumption, and to decrease process cost. To increase the data density of the flash memory cell, i.e. the number of bits that can be stored within a given area, two approaches are currently used. One approach is to scale down the geometry of a single bit memory cell in accordance with the International Roadmap for Semiconductors (ITRS). This roadmap forecasts the use of 90 nm technology in 2004 and 65 nm technology in 2007. Although addressing the individual bit in case of single bit memory cells is easier, such continuous scaling however requires a combined effort of the whole semiconductor industry including semiconductor device manufacturers, equipment and material suppliers. When going from one technology node to another the semiconductor device manufacturer will be obliged to acquire a new generation of semiconductor technology and to convert this technology from a research object into a production worthy tool, which can be a very time and resource consuming process. Another approach to increase the density of the flash memory is to store more than one bit within the charge storage layer of the memory cell. One can distinguish multi-state or multi-level memory cells in which a different amount of charge can be stored at the same location within the charge storage layer, each amount corresponding to a different value of the bit. In this respect the absence of charge corresponds to a "0" value of bit, a first amount of charge to a "1" value, a second, higher, amount of charge to a "2" value, etcetera. U.S. Pat. No. 6,320,786 "Method of controlling a multi-state NROM" illustrates such a multi-level memory cell in the form of a multi-state NROM device. Such a multi-state or multi-level approach would require a precise control over the amount of electrical charge trapped within the charge storage layer so as to obtain clearly distinct data values. Although the number of bits stored in a memory cell is, in first instance, not coupled to the minimal feature size of the technology used, in practice this multilevel approach is limited to a few bits per cell. An alternative approach is to store multiple, substantially identical, amounts of charge at different locations along the channel length within the same charge storage layer. With each of these locations a bit is associated having either a "0" value, i.e. no charge stored at this location, or a "1" value, i.e. a dedicated amount of charge stored at this location. U.S. Pat. No. 6,580, 120 "Two bit non-volatile electrically erasable and programmable memory structure, a process for producing the memory structure and methods for programming, reading and erasing the memory structure" discloses a dual bit flash EEPROM, in which a single FET functions as a memory cell. The disclosed flash cell uses a Field Effect Transistor (FET) in which silicon nitride is used as gate dielectric to store charge therein, while the polysilicon gate is used as program gate. By appropriately reversing the applied voltages, a bit can be stored at either the source or the drain side of the FET. Each bit of the two bits within the memory cell can have a "0" or "1" value depending on whether or not charge is stored at the corresponding location. Although this approach offers a dense memory structure by forming adjacent polygates, this approach does not solve the scaling problem completely, as this multibit approach only allows storing two bits under each gate electrode.

SUMMARY OF CERTAIN INVENTIVE ASPECTS OF THE INVENTION

One aspect of the invention provides a high-density flash memory matrix. In one embodiment, this memory matrix comprises a memory cell capable of storing multiple bits, the numbers of preferably being significantly more than 2.

Another aspect of the invention provides a device and methods, in particular a selection structure comprising a source adjacent to a first gate and a drain adjacent to a second gate. Under control of the first and second gate current can flow between the source and the drain at a selected point along the width of this selection structure. In one embodiment, this point is selected by applying a voltage drop, having a predetermined slope, over at least one of these two gates, while the voltage along the other gate is kept constant or has a slope opposite this predetermined slope. In one embodiment, this selection structure is used as a multibit memory cell whereby charge is stored at a location associated with this selected point.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIG. 1 shows a schematic cross-section of a dual-gate memory cell according to an embodiment of the present invention

FIGS. 4a to 4d show schematic cross-section of a dual-gate memory cell according to a preferred embodiment of the present invention at different stages in the manufacturing process

FIG. 6a-c illustrate the mechanism to address individual bits along the width of the memory cell, according to one embodiment of the present invention.

FIG. 8 shows (a) a top view of a memory cell with the logarithm of the injection current as function of longitudinal position and (b) a top view of the same cell illustrating the multiple bits stored in longitudinal direction, according to another embodiment of the invention FIG. 9 gives experimental results of subsequent programming, reading and erasing of a bit at various longitudinal positions in a memory cell according to a preferred embodiment FIG. 11a-f illustrate various dual gate selection devices according to another aspect of the invention.

DETAILED DESCRIPTION OF CERTAIN EMBODIMENTS OF THE INVENTION

Figure 2C:
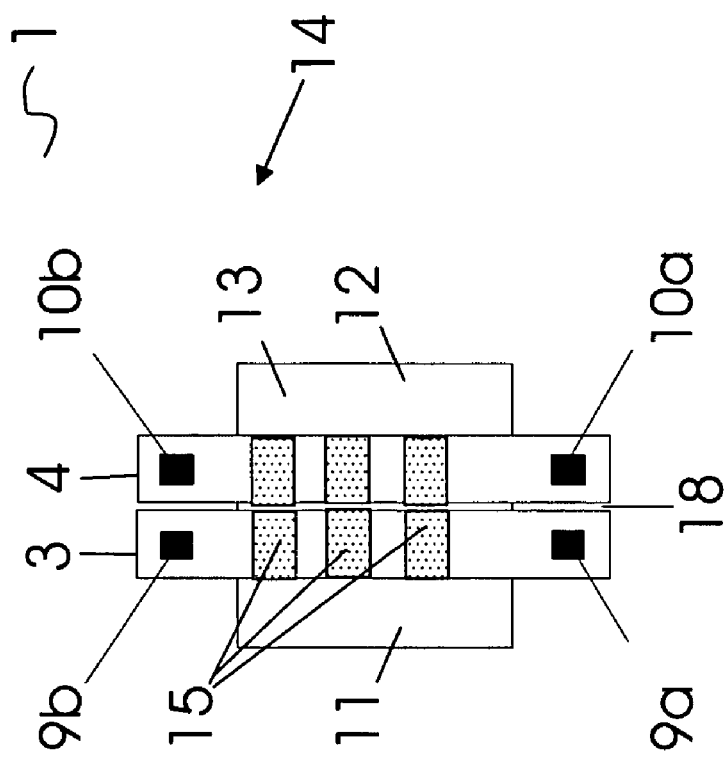
FIG. 2 shows a schematic top view of the dual gate memory cell (a) of FIG. 1, while (b) (c), illustrate other embodiments of the invention

In relation to the drawings, embodiments of the present invention are described in detail. In various embodiments, the device comprises a first and second semiconductor structure, preferably parts of a semiconductor substrate, and electrically coupled to a first and a second region, so that a current can be induced to flow from the first to the second region, via the structures. The semiconductor structures are placed adjacent each other, and are separated by an interface, e.g. a line between two zones in the substrate. Current will cross this interface, when the current is induced to flow between the first and second zone. In one embodiment, the device further comprises means to modulate the conductivity in at least one of the structures, so that if current flows across the interface, the current value will be a non-monotonic function of the location along the interface. In one embodiment, the current resembles an impulse function along the interface, so that the current can flow only at a predefined position along the interface, and no current can flow at either side of the predefined position. The variation of the conductivity preferably takes on the form of a conductivity gradient, a continuous rise or fall of the conductivity along the interface. In that case, there is a gradient in both semiconductor structures, and the gradients are opposed to each other, i.e. if there is a rise in conductivity in one structure along a given direction, there is a fall in conductivity in the other structure along the same direction.

Embodiments of the invention are shown in FIGS. 1 and 2. In one embodiment, the device is a memory cell, based on a dual gate structure. It comprises a source and a drain region 11 and 12 (i.e. first and second regions), separated by a channel region, including a first and second part 16 and 17 (i.e. first and second semiconductor structures). Two separate and adjacent gate electrodes 5 and 7 (means for modulating conductivity) are present above these channel parts 16 and 17 respectively, and separated therefrom by dielectric layers 6 and 8, while being separated from each other by an insulation layer 18. If the device is to serve as a memory cell, at least one of these dielectric layers comprises a charge-storing layer 26, capable of receiving and storing an amount of charge. The gate electrodes 5 and 7 are longitudinal in shape and preferably placed immediately adjacent each other, i.e. spaced only by the insulating layer 18. The distance between the gate electrodes may be larger according to one embodiment however, as will be explained later.

Throughout the following description, the 'width' direction of the device indicates the direction along the interface between the gate electrodes (direction W, see FIG. 1), corresponding to the width of the channel between source and drain. The 'length' of the device is measured in the direction perpendicular to that (direction L), i.e. corresponding to the length of the channel. The longitudinal direction of the gate electrodes themselves, i.e. defined by their shape, thus coincides with the W-direction. Left and right are only used to indicate opposite positions. First and second are only used to distinguish between similar structures at different locations. Similar features are designated using similar symbols throughout the description.

One embodiment of the invention includes, on each of the electrodes 5 and 7, two separate contacts (9a, 9b or 10a, 10b), on either side of these electrodes, along the width of the device. The contacts are arranged so that a different voltage can be applied to each of the contacts on one gate electrode. The idea is to introduce the possibility of applying a voltage gradient along the longitudinal direction of the gates, thereby creating the conductivity gradient mentioned above. As the voltage gradients are opposed to each other, and by the interaction of the gradients along both gate electrodes, one can thus create alternative paths for the source-drain current, in order to store a charge in a plurality of locations along the width of the gates. This general principle will hereafter be explained in more detail, based on a number of embodiments of the device and its methods of operation.

One embodiment of the present invention provides inter alia a memory cell capable of storing multiple bits along the width of the memory cell. The mechanism for addressing each individual bit in the memory cell is independent of the minimal feature size F of the technology. The number of bits in each cell is independent of the technology scaling. In one embodiment, the memory cell only relies on common MOS (Metal-Oxide-Semiconductor) process technology and requires the formation of at least one additional contact to each of the gate electrodes.

A cross section of a dual gate memory cell according to a first embodiment of the present invention is shown in FIG. 1. The memory cell 1 comprises a semiconductor substrate 2 on which a first gate 3 and a second gate 4, adjacent to and insulated 18 from this first gate 3, are present. The first gate 3 comprises a first gate electrode 5 and a first gate dielectric 6 insulating the first gate electrode 5 from the semiconductor substrate 2. The second gate 4 comprises a second gate electrode 7 and a second gate dielectric 8 insulating the second gate electrode 7 from the semiconductor substrate 2. At least the second gate dielectric 8 comprises at least one charge-storing layer 26, e.g. a dielectric layer capable of storing charge thereon. Optionally also the first gate dielectric 6 comprises at least one charge-storing layer, e.g. a dielectric layer capable of storing charge thereon. In the latter case a symmetrical memory cell is obtained and charge can be stored in one and/or in either of the gate dielectrics as will be explained in more detail in other embodiments of the invention. Although the memory cell shown in FIG. 1 comprises two gates, a first gate 3 and a second gate 4, the invention is not limited thereto. The memory cell can comprise more than two adjacent gates. Such a multiple gate memory cell can be formed using, for example, the process sequence disclosed in U.S. Pat. No. 6,580,120, hereby incorporated by reference in its entirety.

As shown in FIG. 2a, on opposite sides along the longitudinal direction of the first 3 and second gate 4, a contact (9a, 9b, 10a, 10b) is present, such that a voltage difference can be applied along the longitudinal direction of the first as well as of the second gate. Hence these opposite contacts (9a and 9b, 10a and 10b) are not short-circuited or in direct ohmic contact and can be biased to the same or different voltages. Preferably on-chip biasing circuitry is foreseen to apply appropriate and selected voltages to each of the four contacts (9a and 9b, 10a and 10b). As will be further discussed, the voltage drop along this distance between these two opposite contacts determines the number of bits than can be stored within a memory cell according to one embodiment of the present invention. The memory cell further comprises a source region 11 and a drain region 12; the source region is lying adjacent to and extending at least partly along the first gate and the drain region lying adjacent to and at least partly extending along the second gate. Depending on the process conditions, such as the implantation parameters, thermal budget, the junctions formed in the source and drain region might partially extend under the adjacent gates.

FIG. 2a shows a schematic top view of the dual gate device shown in FIG. 1. An active area 13 is shown, surrounded by insulating regions 14, better known as field regions. Two gates 3, 4, parallel to and adjacent to each other, are formed over the active area 13, preferably parallel to the active area 13 and extending over the edges of the active area 13. At opposite sides of the two gates, a source region 11 and a drain region 12 are formed in the parts of the active area not covered by the gates. At each end of each of the two gates a contact (9a and 9b, 10a and 10b) is present, such that an electrical path is created from one end contact to the other end contact via the gate electrode contacted by these two corresponding end contacts.

Figure 2B:
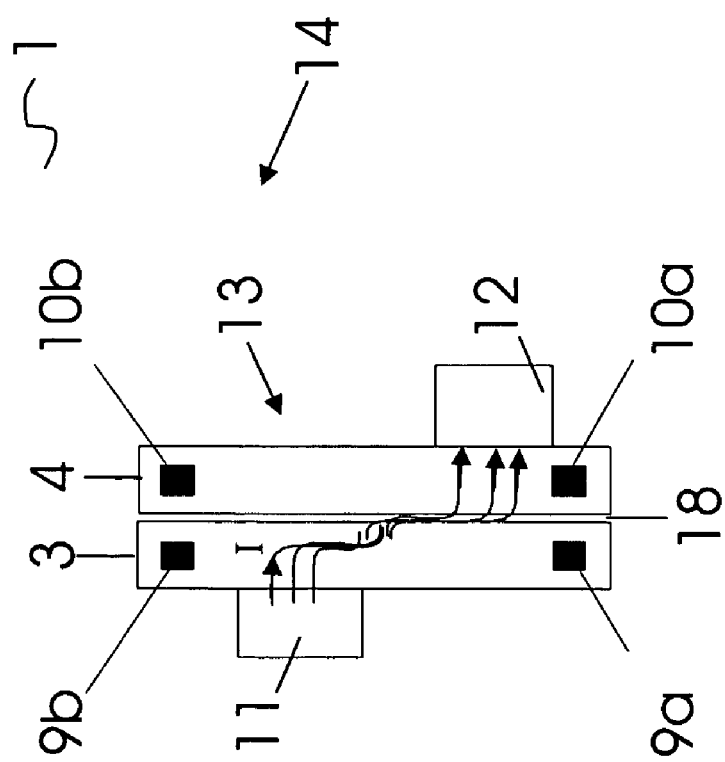

FIG. 2b shows a schematic top view of a dual gate according to another embodiment of the present invention. Also here two gates 3, 4, parallel to each other, are formed over the active area 13, preferably parallel to the active area and extending over the edges of the active area. At opposite sides of the two gates a source region 11 and a drain region 12 are formed in the non-overlapped parts of the active area. At each end of each of the two gates a contact (9a and 9b, 10a and 10b) is present, such that an electrical path is created from one end contact to the other end contact via the gate contacted by these two corresponding end contacts. In the memory cell illustrated by FIG. 2a or 2b, charge can be stored at any point in longitudinal direction (along W-axis) because the second gate dielectric 8, and optionally the first gate dielectric 7, comprises at least one continuous charge-storing layer, i.e. extending, capable of storing charge thereon. This charge-storing layer extends along the corresponding gate electrode, i.e. along the full longitudinal dimension of the gate. In the memory cell of FIG. 2c however charge can be stored only at well-defined regions 15 along the longitudinal direction, as indicated by the spots. The charge-storing layer now includes these individual, mutually isolated regions 15, each region capable of storing charge thereon, and each region will correspond to the position of a bit. These regions 15 can be made of polysilicon and oxide can be used to insulate these polysilicon regions from each-other and from the substrate 2 and the gate electrode 7. Alternatively these regions can be made of nitride and oxide can be used to insulate these nitride regions from each other and from the substrate and the gate electrode. If a dielectric or another non-conductive material, e.g. nitride, is used to form the charge-storing layer, regions 15 at corresponding positions in adjacent gates can be connected so as to form a strip of charge storing dielectric material in a direction perpendicular to the direction of the gate electrode. This way a grid structure is obtained comprising a first level of spaced apart strips 15 of a charge-storing dielectric and a second level of gate electrodes 3, 4. A person skilled in the art will realize that such regions 15 should be present at least underneath one gate electrode if the device of FIG. 2c is to be a memory device.

The semiconductor substrate 2 can be a bulk silicon wafer, a silicon-on-insulator substrate or of any type of semiconductor substrates used by a person skilled in the art. The first gate 5 and second gate 7 electrodes can be formed of silicon. Typically polysilicon is used to form these gate electrodes. The first gate dielectric 6 can be formed of an oxide. In case of a silicon substrate 2, a silicon oxide is thermally grown on this substrate to form the first gate dielectric. The second gate dielectric 8 can be formed of a non-conductive material in which charge can be stored and which material is capable of locally storing and retaining charge injected to selected locations within this gate dielectric. This non-conductive material will prevent diffusion or displacement of the injected charge within this gate dielectric. Typically silicon nitride is used as charge-storing material. Optionally this charge-storing dielectric is sandwiched in-between dielectric layers, which insulate the charge-storing dielectric from the substrate on the one hand and from the second gate electrode on the other hand. Typically these sandwich dielectric layers are formed from silicon oxide. The use of such charge-storing dielectrics is disclosed in PCT application WO09907000 "Two bit non-volatile electrically erasable and programmable semiconductor memory cell utilizing asymmetrical charge trapping", hereby enclosed by reference in its entirety.

Figure 3B:
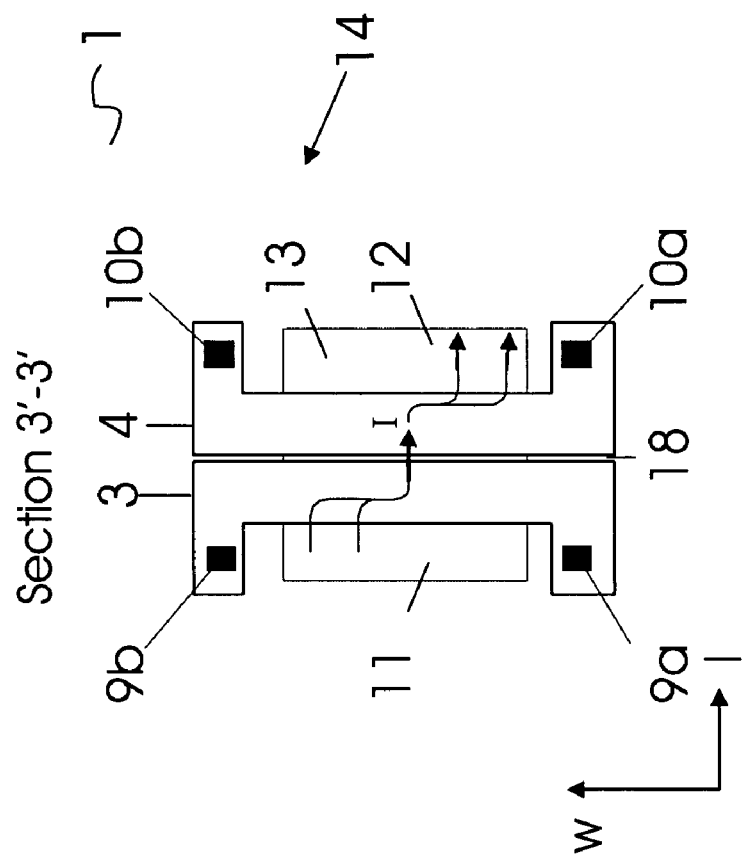
FIG. 3 shows a schematic cross-section (a) of a dual-gate memory cell according to another embodiment of the present invention, and a top view thereof (b)
Figure 3A:
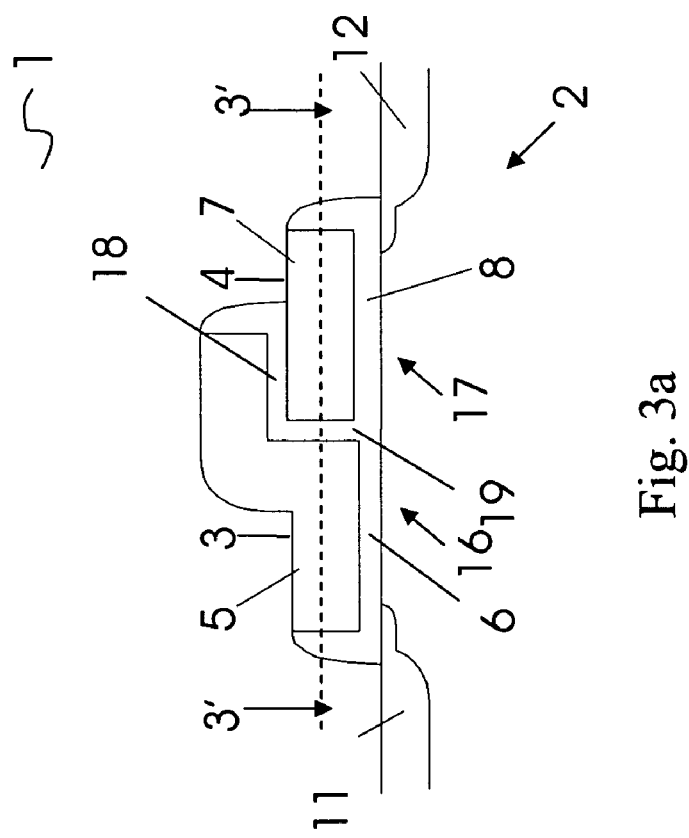

FIG. 3 shows a memory cell according to one embodiment of the invention, namely a split gate SONOS cell. FIG. 3a shows a schematic cross-section of this dual-gate device 1. The gate 3 at the source side 11 of the dual gate device uses silicon-oxide as gate dielectric 6, while the gate 4 at the drain side 12 uses an ONO (oxide-nitride-oxide) stack gate dielectric 8. In this dielectric stack 8 the nitride layer is used as charge-storing dielectric layer, hence the label SONOS. The gate electrode 3 at the source side overlaps, at least partly, the gate electrode 4 at the drain side. The channel region, formed in the substrate in between the source and the drain, includes a first part 16 controlled by the source side gate 3 and a second part 17 controlled by the drain side gate 4. The source side gate 3 overlaps, at least partly, the drain side gate 4. Both gates of the dual-gate device are insulated from each-other by a dielectric 18 thereby yielding a capacitive coupling between both gates. At both ends, along the longitudinal direction, of each gate contacts are made. Each of these four contacts (9a and 9b, 10a and 10b) can be biased independently from the other contacts. As shown in the top view of FIG. 3b each gate is widened at each end to offer sufficient space for forming a contact (9a and 9b, 10a and 10b) thereupon.

The method for manufacturing the device of FIG. 3 is illustrated in FIG. 4. FIG. 4a illustrates a silicon substrate 2 comprising an active area 13 surrounded by field regions 14. In this substrate pwell, nwell or other doped regions might be formed as will be appreciated and known by a person skilled in the art, in order to obtain regions having a giving conductivity type.

The gate dielectric stack 8 of the second gate 4 is formed by growing an oxide on top of this substrate, followed by the deposition of a nitride layer and an oxide layer on top of this nitride layer. A polysilicon layer is deposited, which layer will be used to form the second gate electrode 7. This stack of oxide, nitride, oxide and polysilicon layers is patterned to form the second gate 4 in this active area. Then an oxide is grown which is used as gate dielectric 6 of the first gate 3, followed by the deposition of another polysilicon layer, which will be used to form the first gate electrode 5. This gate oxide is also grown on the polysilicon of the second gate and will therefore form an insulating layer 18 between the first 5 and second 7 gate electrode. This stack of oxide and polysilicon layers is patterned to form the first gate electrode 3 overlapping the second gate 4, as shown in FIG. 4b.

Figure 4C:
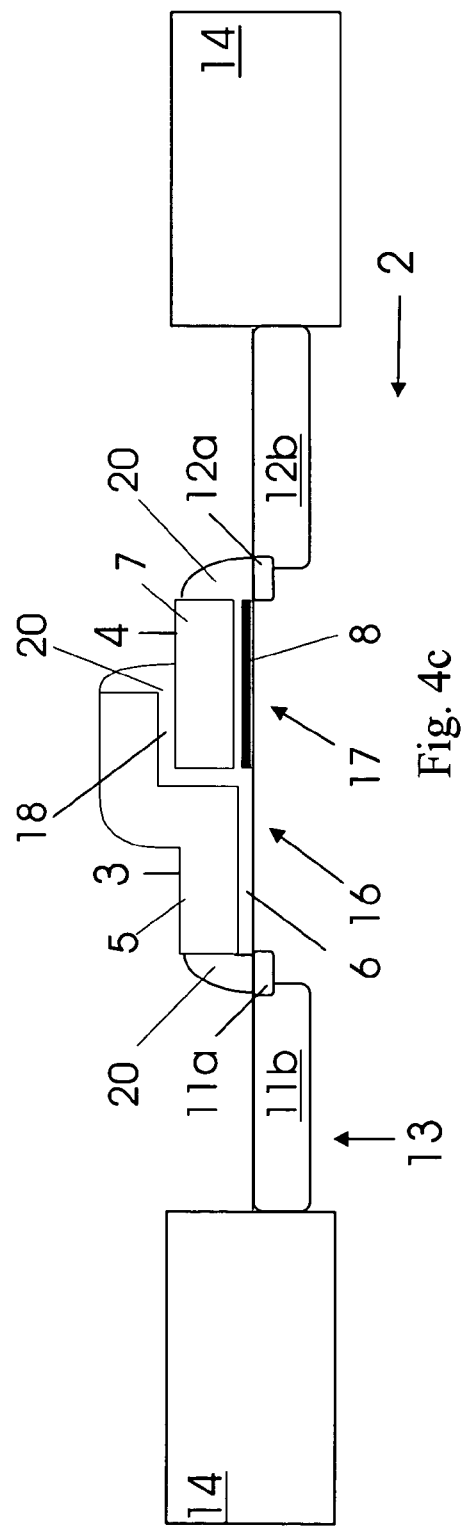

Aligned to the structure of the first 3 and second 4 gate lightly doped regions 11a, 12a are implanted, followed by the formation of spacers 20 which are used to offset during implantation the highly doped regions 11b,12b from the first 16 and second 17 channel regions. FIG. 4c shows the device at this stage of the processing.

Figure 4D:
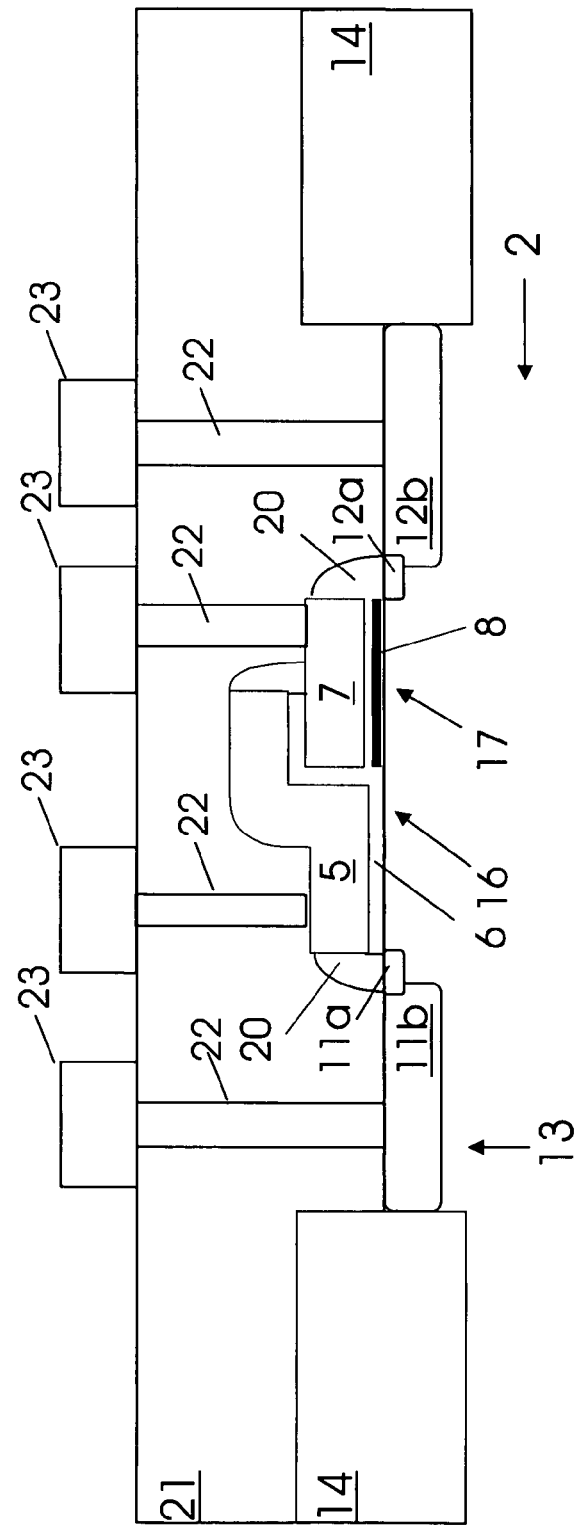

An insulating layer 21 is deposited over the substrate, which layer will insulate the substrate and the devices present thereupon from the interconnect level formed later on. In this insulating layer openings 22 are etched to expose the source 11 and drain 12 regions and both ends (9a and 9b, 10a and 10b) of each gate electrode 3, 4. These openings 22 are filled with a metal to form a contact to the exposed regions. A metal layer 23 is deposited over this insulating layer and is then patterned to form a first interconnect pattern. FIG. 4d shows the device at this stage of the processing. The sequence yielding FIG. 4d can be repeated as known by a person skilled in the art to form multiple interconnect levels, whereby the openings are etched in each dielectric layer to form a connective path between different interconnect levels.

Figure 5:
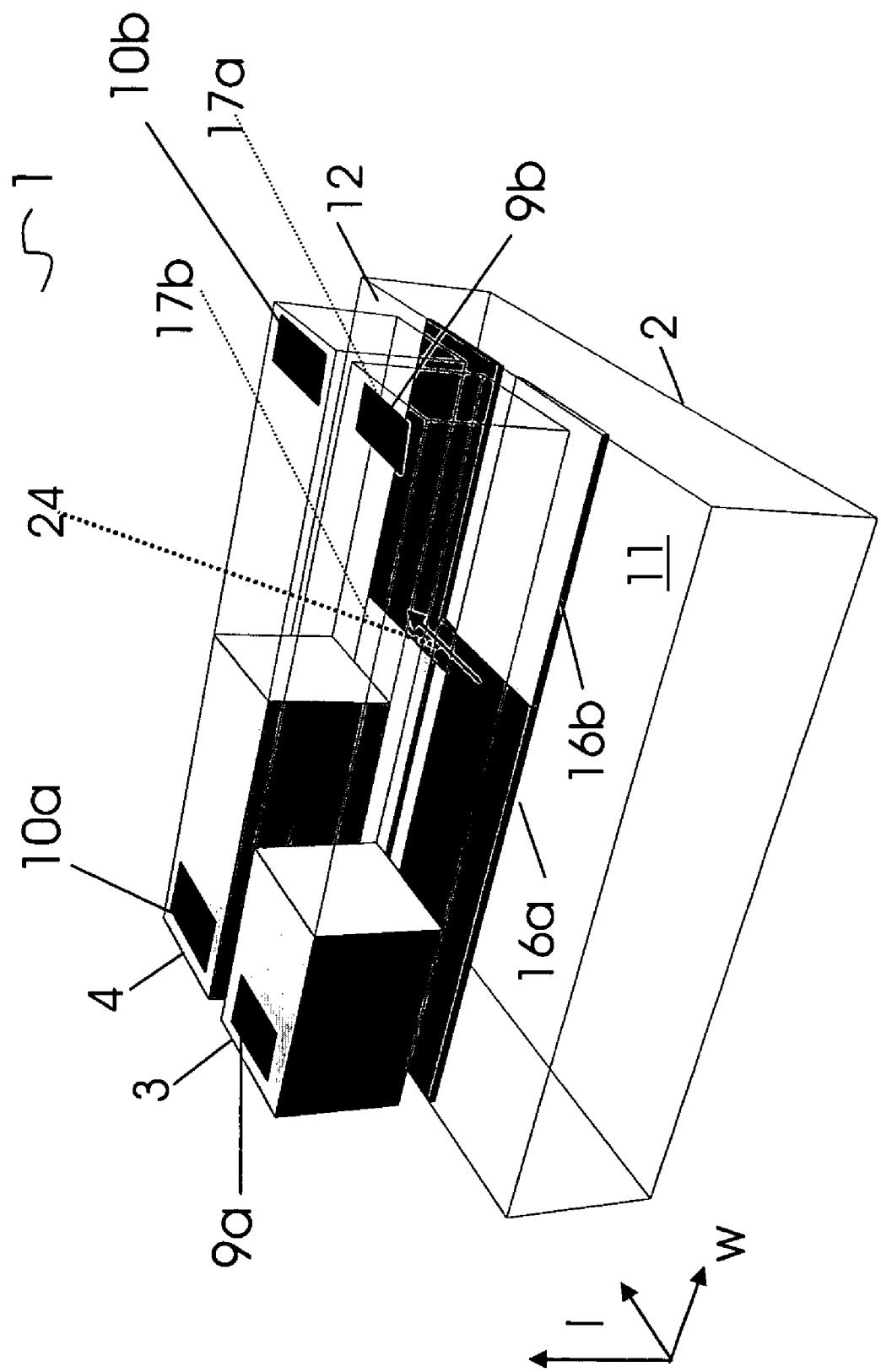
FIG. 5 shows a 3D schematic presentation of the device illustrated in FIG. 1

One embodiment of the invention is equally related to methods for operating a multibit memory cell. In this aspect methods for programming, reading and erasing the individual bits of the memory cell of the first aspect are disclosed. Multiple methods exist for operating a prior art dual-gate memory cell and for storing, reading or erasing a bit in a charge-storage layer. However, these prior art memory cells only allow storing a single bit along the width of the memory cell. With reference to FIG. 5 the memory cell 1, in one embodiment, can be regarded as being a parallel connection of at least one dual gate structure, comprising a first gate 3 and a second gate 4. Underneath each gate 3, 4 a corresponding channel region 16, 17 is present. When the memory cell 1 is biased, as will be explained below, each channel region 16, 17 can, over at least a part of the device width, be inverted (regions 16a, 17a), while the remaining part of the channel region might be non-inverted (regions 16b, 17b). At that point in longitudinal direction where both inverted channel parts 16a, 17a overlap a bridge or cross-over point 24 is present.

FIGS. 6a to 6c illustrate the operation of the memory device according to one embodiment of the invention, and the way in which it differs from prior art devices. The operation and layout of a conventional single-gate MOSFET is shown in FIG. 6a. The gate 3 of this transistor is biased at a single voltage yielding a substantially constant electrical potential along the gate electrode. Typically a single contact 9a at one end of the gate is used to bias the gate electrode, but in case of long transistors multiple contacts to the gate can be used, but these contacts are linked to each-other as to yield a uniform electrical potential along the gate electrode. This uniform gate potential will create a uniform current flow I in the channel, controlled by this gate electrode, from the source side to the drain side of the transistor, as indicated by the arrows of FIG. 6a. In the top part of FIGS. 6a, 6b, and 6c the logarithm of the channel current (log Id) is plotted as a function of the position along the width w of the device. In the situation of FIG. 6a the log Id curve is constant in this longitudinal direction. If both longitudinal ends 9a, 9b of this single-gate transistor are contacted and biased at different voltages, a voltage drop is created along the longitudinal direction of the gate electrode. This contact scheme is shown in FIG. 6b, where a voltage below the threshold voltage of the transistor is applied to the contact 9a at one end of the gate electrode, while a voltage above this threshold voltage is applied to the contact 9b at the opposite end of the gate electrode. As indicated by the arrows the current flow I in the channel is no longer uniform along the width, but will vary in correspondence with the variation in the gate electrode potential. Only in these channel regions 16a (dotted area) where the corresponding gate potential is above threshold an inversion region is formed and current will flow, while in remaining part 16b (white area) of the channel no current will flow, as this part is not inverted. In the log Id curve in the top part of FIG. 6b, this is illustrated by the fact that at the border between the inverted 16a and non-inverted 16b part of the channel the current drastically drops.

FIG. 6c shows the dual-gate memory cell according to one embodiment of the present invention. In accordance with the embodiment of FIG. 2a, each gate electrode 3, 4 is contacted at both ends (9a and 9b, 10a and 10b) and at each contact a different voltage can be applied, such that a voltage gradient, in this case a voltage drop from one contact to the other, is created over each gate electrode. The potential drop of the adjacent gate electrodes is in opposite direction, meaning that, if the gate voltage increases along one gate electrode (in case of gate 3 increases from 9a towards 9b), it decreases along the adjacent gate electrode (in case of gate 4 decreases from 10a towards 10b). In the dual gate device, in one embodiment, current will only flow from the source to the drain side if the inversion region created by a voltage of the first gate at least partly overlaps 24 with the inversion region created by a voltage of the second gate.

Figure 7:
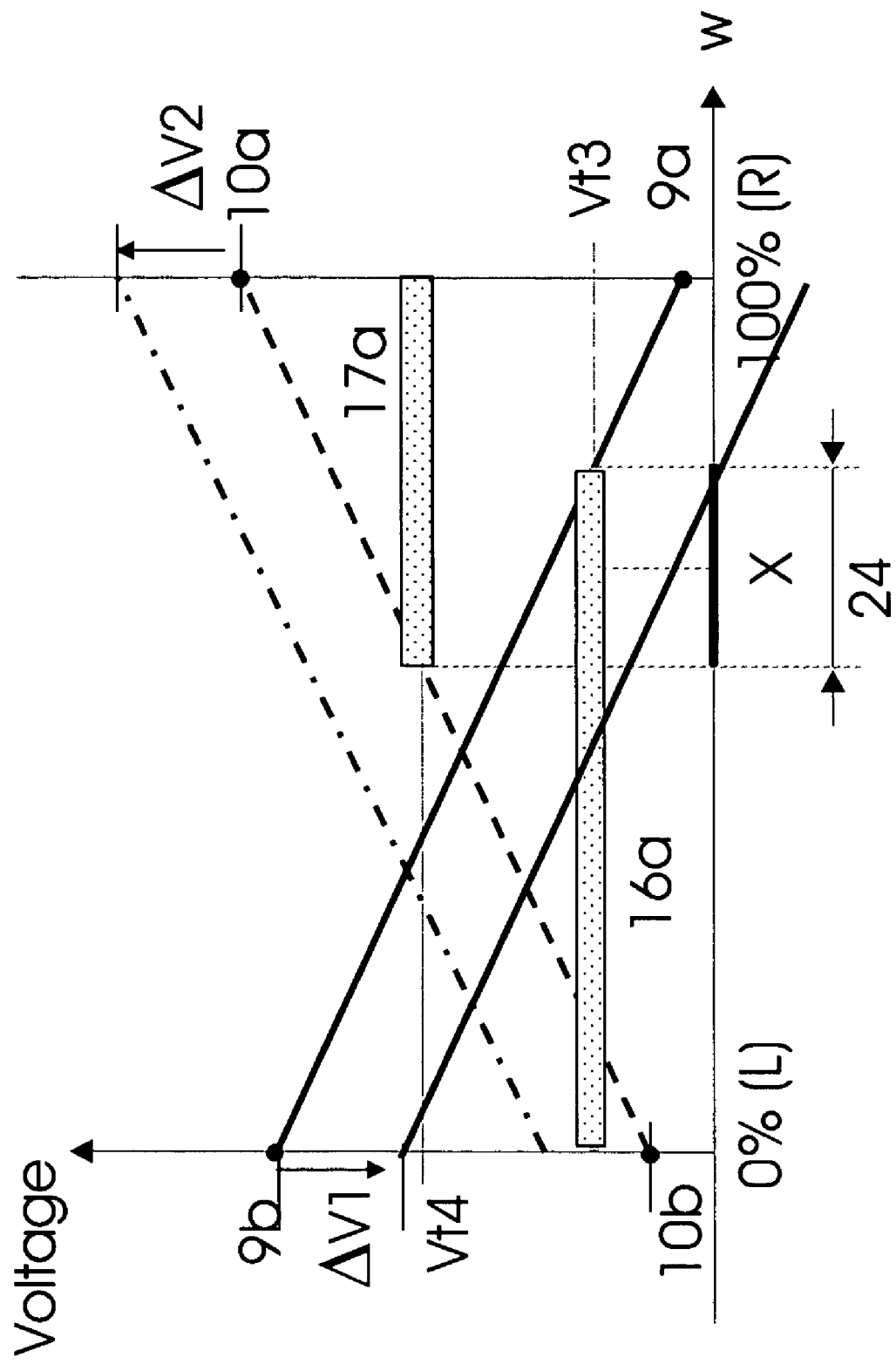
FIG. 7 shows the change in electrical potential along each gate of the dual-gate memory cell, according to one embodiment of the present invention

FIG. 7 illustrates for both gate electrodes the variation in gate voltage along the width of the device. Whereas the voltage along the first gate 3 (higher thick solid curve in FIG. 7) decreases when going from left 9b to right 9a in FIG. 6, the voltage along the second gate 4 (lower thick dashed curve in FIG. 7) increases when going from left 10b to right 10a in FIG. 6. The slope of each voltage curve will depend on the voltage difference applied over each gate electrode, the length of each gate and on change of the resistance of the gate electrode along its length. Selecting the appropriate material or material composition can modify the latter: e.g. metal lines, polylines that can be fully or partially silicided in longitudinal direction. The resistance of the gate electrode can also be voltage dependent, e.g. as is the case if a lowly doped polysilicon layer is used as gate electrode material. When applying a positive voltage to such a lowly n-doped polysilicon layer, this layer will be depleted, the degree of depletion at each point being dependent upon the doping level and the electrical potential at that point. In one embodiment, a linear voltage drop over the gate electrode is assumed, although the invention is not limited thereto. In this example a first inversion region 16a is created in the first channel 16, i.e. the channel controlled by the first gate 3, where the gate voltage is above threshold: $V_{gs}>V_{t3}+V_s$, whereby the source 11 is typically biased to zero volt: $V_s=0V$. A second inversion region 17a is created in the second channel 17, i.e. the channel controlled by the second gate 4, where the gate voltage is above threshold: $V_{gd}>V_{t4}$, as the drain side 12 is biased to a voltage Vd. An overlap 24 between both inversion regions exists at the crossover of both gate voltages in a region where both gate voltages are above or about their corresponding threshold voltages. By varying the slope of one or both of the gate voltages differences or by increasing the voltage applied to one or more of the end contacts the width of this crossover point can be determined. The crossover point 24 can be shifted along the gates by varying the voltages applied at the end contacts as indicated in FIG. 7. In FIG. 7 it is shown that the crossover point 24 can be moved to the left side of the device by decreasing the voltages applied to the end contacts 9a and 9b by an amount $\Delta V$ and increasing the voltages applied to the end contacts 10a and 10b by the same amount $\Delta V$ as illustrated by the lowering of the thick line by $\Delta V1$ and by raising the dotted line by $\Delta V2$, the crossover point being shifted to the left. $\Delta V1$ and $\Delta V2$ can be equal to each other.

Whereas in the above example a voltage difference is applied to both gate electrodes, necessitating the need for an electrical contact at each end, as is illustrated in FIG. 2a, one can optionally choose to only apply a voltage difference to one of the two gates and to apply a fixed voltage to the other gate. The crossover point in this case is defined as the region where the gate voltage of the gate to which a voltage difference is applied is above or about its corresponding threshold voltage.

In the following paragraph programming, reading and erasing mechanisms of a device according to one embodiment of the invention, are briefly explained. These operating mechanisms are now in the art for memory devices capable of storing only a single bit along the width of the memory cell. This device is programmed as follows. By applying 5V to the drain and 9V to second gate, i.e. adjacent to the drain, an inversion region is created in the second channel, which inversion region will act as a virtual drain underneath the second gate as the channel potential at the source side of this second gate is 5V, equal to the drain bias. When a bias voltage slightly above the threshold voltage of the first transistor is applied to the first gate electrode, an inversion layer is induced in the first channel underneath this first gate electrode. The first channel region is pinched off at the drain side of the first gate, inducing a large lateral electrical field at the border between the first and the second gate. This large lateral electrical field creates hot electrons, which are swept into the ONO dielectric at the source side of the second gate, also labelled as the carrier injection point, due to the large bias voltage on this second gate. This completes the program operation.

For reading, a high bias voltage is applied to the first gate thereby creating an inversion region in the first channel. This inversion region will act as a virtual source underneath this first gate. Moderate voltages are applied to the second gate and to the drain. Charge trapped in the ONO stack at the source side of the second gate will now modulate the potential barrier of the virtual source towards the second channel region and hence the overall current flowing through the device. A person skilled in the art will realize that also the gate dielectric of the first gate can consist of an ONO-dielectric stack thereby rendering the memory cell symmetric. Hence a bit can be stored underneath the first and/or second gate electrode, allowing up to two bits to be stored in the cell in the width direction.

For erasing, hot holes are generated near the drain side and injected into the ONO stack to compensate the electrical charge stored in the ONO stack during programming. A negative bias is applied to the second gate in order to attract the holes generated near the drain, by band-to-band tunneling. A slightly positive voltage is applied to the first gate to repel these hot holes from drifting towards this first gate.

As shown in FIG. 8 one can apply the above operating mechanisms to a memory device according to one embodiment of the present invention. A cross-over region 24a along the gates of this memory cell is selected according to one embodiment of the present invention on the memory cell. As explained above, the potential drop of the adjacent first 3 and second 4 gate electrodes are in opposite direction or alternatively a potential pulse is applied to the first gate 3 only while a constant voltage is applied to the second gate 4 as illustrated by the voltage biasing scheme depicted in FIG. 15. By selecting the appropriate biasing voltages at each contact (9a and 9b, 10a and 10b), the current I flowing from the source 11 towards the drain 12 can be forced to run across the spacing 18 between the first gate 3 and the second gate 4 at a well-defined region 24a along the width of the transistor, as indicated by the arrows in FIG. 8b. Within this region 24a hot electrons will be injected into the ONO stack of the second gate as explained above. In the top part of FIG. 8a the logarithm of the injection current (log Iinj) is given as function of the position along the width of the device. The hot electron injection current into the gate dielectric is a function of the device current: only at or near the overlap region 24a the channel current can provide sufficient hot carriers to be injected into the gate dielectric. As explained above the hot carrier injection also requires a large lateral field at the drain side of the first gate 3. This large lateral field occurs at the point 24b where the gate voltage of the first gate 3 is at or slightly above its corresponding threshold voltage. A similar lateral electrical field distribution assisting in injection of carriers into the gate dielectric can be obtained when a constant voltage is applied to gate 4 while a voltage gradient is applied to gate 3. In this way a bit is stored at the selected position of the injection point 24b. Increasing the drain 12 and bias voltage at the second gate 4 can accomplish the writing of charge at this selected spot along the width of the memory cell. This increased bias will increase the lateral field at the border between the first 3 and the second 4 gates and allow hot electron injection into the ONO-dielectric 8. Appropriate biasing allows this injection current Iinj to have a sharp maximum at a small spot along the width of the memory cell as shown in the log Iinj plot. Simultaneously ramping up the voltages at the end contacts, e.g. first gate contacts 9a, 9b, of one gate, e.g. the first gate 3, and optionally ramping down the voltages at the end contacts, e.g. second gate contacts 10a, 10b, of the adjacent gate, e.g. second gate 4, moves this injection point 24 in longitudinal direction up or down. Consequently at each selected crossover point electrons can be injected resulting in a series of bits stored in longitudinal direction of the multibit memory cell, as indicated by the round black spots in FIG. 8b. As is the case for the single bit split-gate SONOS device a selected bit in the multibit split-gate SONOS memory cell, in one embodiment, can be read, by applying a low drain bias, while the bit can be selected by applying appropriate voltage drops over both gates to have the crossover point substantially coinciding with the position of the bit to be read. Finally, erasing of the entire channel can be accomplished in the same way as described for the single bit split-gate SONOS cell.

Measurements have been performed on a prototype n-type memory cell according the preferred embodiment with 5/10/5 nm ONO (7) and 12 nm oxide dielectric (5) underneath the second 4 and first gate 3, respectively. The memory cell has a salicided first 3 and second gate 4 with drain- and source-side gate lengths of 0.2 µm and 0.3 µm, respectively, and a device width Wcell of 100 µm. The measurements have been performed with voltage drops over the first and the second gate of 5V, a drain bias of 5V for programming with a 100 µs programming drain pulse and a drain bias of 1V for reading. These values have been selected for demonstration purposes but have not been optimized for memory operation.

Figure 9:
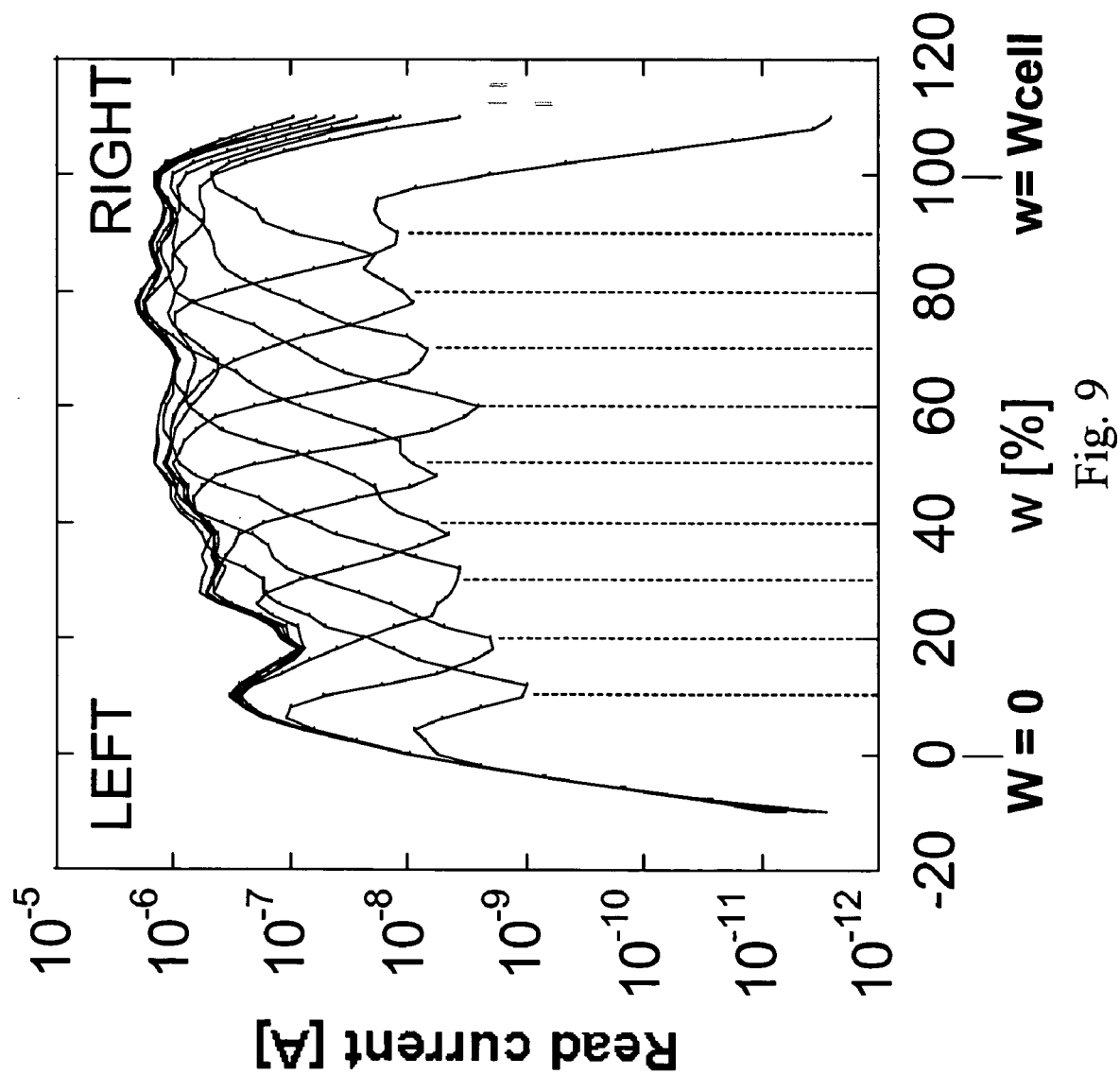

FIG. 9 gives the experimental results obtained on a memory cell according to one embodiment. In this experiment at various positions along the width, expressed as a ratio w (%) of the total device width Wcell, bits are subsequently programmed, read and erased before programming another bit. The measured drain current, as function of the position w (%) of the cross-over point, are plotted in FIG. 9 one on top of another. In one embodiment, small steps of Δw=2% have been used. For reading a bit positioned at a particular position, e.g. a bit previously written at position w=60%, it suffices to position the cross-over point 24 at this same position w=60% and determine the drain current. The magnitude of the drain current will than be indicative for the value of this bit. The width of the peak of each curve in FIG. 9 is defined by a 10 times drop in current relative to the peak value of this curve. This peak width is viewed as the spatial distribution of the charge stored at that position. This peak width corresponds to a voltage drop of about 630 mV. If the total gate differential voltage, i.e. the voltage drop over each of the two gates, is kept constant at 5V, such voltage drop results in a peak-width of 12.6% of the device width: 630 mV/5V. Taking the bit pitch equal to half of the peak-width, allowing about 10% interference of overlap between adjacent bits, ca. 15 bits can be stored in a single cell. This first-order assessment predicts that the number of bits per cell is proportional to the voltage drop along the gate and independent of the device width Wcell, hence the physical bit spacing can be made arbitrarily small by reducing the device width Wcell. Practically, the bit density will be limited by the properties of the trapping medium, e.g. diffusion of the injected charge. Hence, one embodiment of the present invention offers the opportunity for obtaining a pitch between bits in a memory cell to be below the lithography feature size F.

Figure 10B:
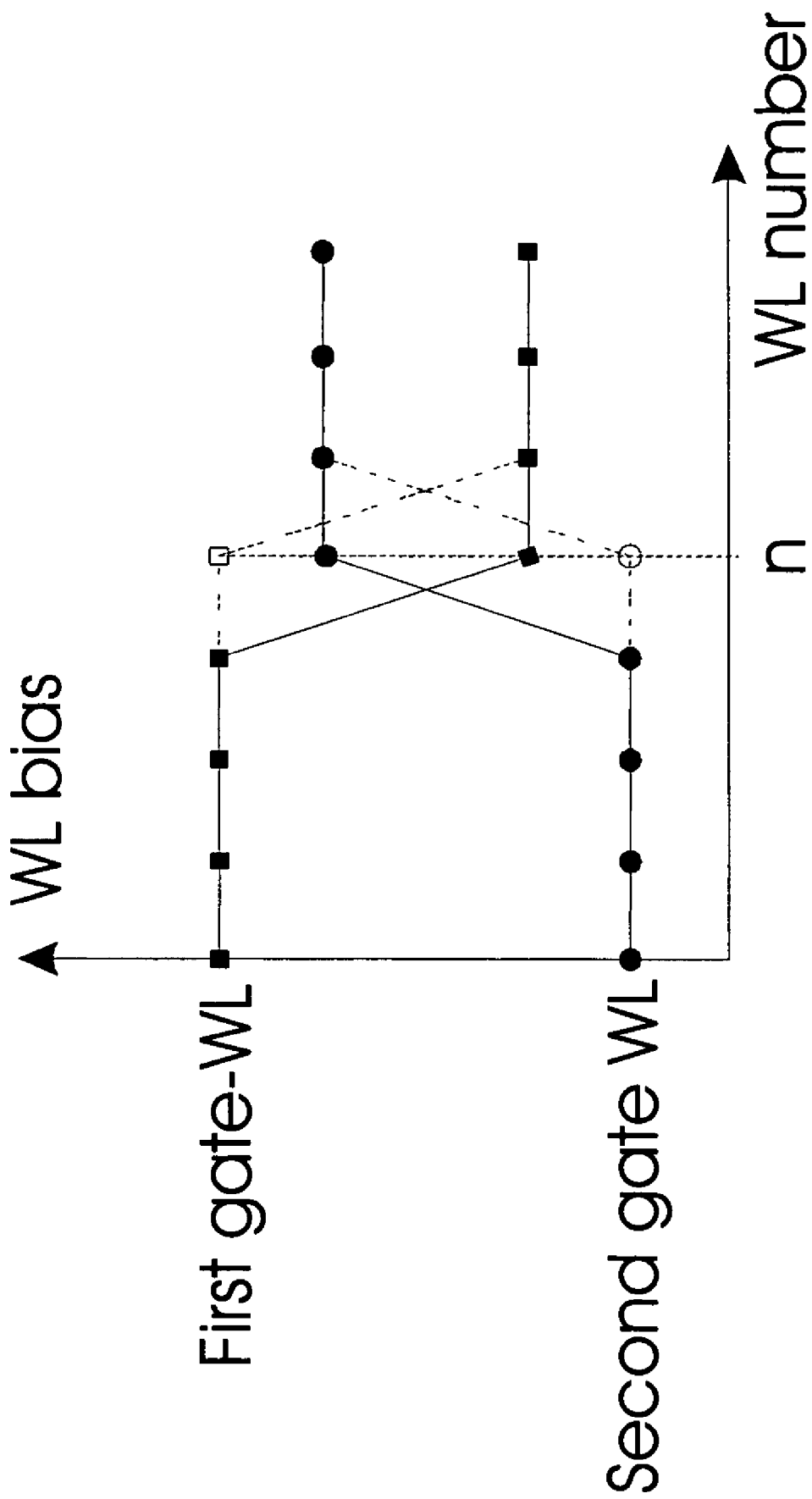
FIG. 10 illustrates (a) a matrix of memory cells according to one embodiment of the present invention and (b) a biasing scheme for such a memory array

Layouts for a memory matrix comprising the memory cell according to one embodiment of the present invention are disclosed. In FIG. 10a, a possible array-layout for such a memory matrix is shown. The memory cell 1 is within the dashed area and has a layout similar to the layout of the memory cell shown in FIG. 3b. Source 11 and drain 12 strips run vertically, first 3 and second 4 poly gates are contacted by metal word-lines running in perpendicular to the source and drain strips (not shown). Separate word-lines are required to respectively contact the first gate and the second gate. In the layout of FIG. 10a contacts (9a and 9b, 10a and 10b) are put on the poly lines within the active area 13 region. The contacts to the first and the second gate are at a spacing of about 2 F as indicated in FIG. 10a. The source 11 and drain 12 regions run underneath the contact regions of the poly lines. Such a memory cell is shown in FIG. 10a with F being the minimal feature size which is characteristic for a given technology node. Assuming a voltage drop over the gates of 10V is used, circa 25 bits can be stored in the memory cell of FIG. 10a. If the bits are spaced 30 nm apart, the area density of bits can be calculated for each technology node using the formula 3F (3F+25×30 nm) area. For F=100 nm, the density of the proposed concept is 1.6 times larger than for a classical single bit split gate SONOS memory cell. These numbers of course critically depend on the number of bits that can be stored in a single cell. In FIG. 10b, a biasing scheme for the layout of FIG. 10 is proposed. Only one row of gate electrodes is biased at a time. The word-line bias on other rows is constant so that no current will flow through the gate electrodes of non-selected rows. In the case of FIG. 10a (thick lines) the cells between WL n−1 and n be can be probed. Altering the bias on WL n (indicated in FIG. 10a by the dotted line) will allow probing cells between WL n and n+1. Note that, each time, only half of the cells can be probed.

As mentioned above, a device, in one embodiment, a memory cell. The distance between the gates 3 and 4 is not determined. For a memory cell working as described above, this distance is preferably not larger than the thickness of the insulating layer 18. However, when the gates are spaced further apart, other components may be placed in the space between the gates. As outlined earlier, the memory device, in one embodiment, comprises a first 3 and a second gate 4 between the source 11 and drain 12 regions. Thanks to the biasing of this first 3 and second 4 gate a current will flow between the source 11 and drain 12 regions at a well-defined position 24 between this first 3 and second 4 gate. By varying the voltage drop (9a to 9b, 10a to 10b) over one or over both of these gates this current bridge 24 can be shifted along the width of the memory device and selected points can be addressed. If the first and second gates are spaced apart other devices 25 or structures can be inserted in between the first 3 and second 4 gate. The biasing of this first and second gate is then used to control the position at which current will flow through or in the vicinity of this intermediate structure. A device according to this embodiment can be used to control, sense or influence the operation or physical state of this intermediate element at selected points. This intermediate element can be formed in the substrate, e.g. as trench in-between the first and the second channel which is filled with a selected material. It can also be formed upon the substrate in-between the first and second gate. This intermediate element can have a continuous character, e.g. formed as a strip of material, or can consist of discrete elements, e.g. separate blocks of material or an array of individual components such as sensors which are located at predefined positions along the width of the dual selection structure.

FIG. 11a schematically illustrates the general concept of this dual gate structure by means of schematic cross-section. At the source side 11 a first gate 3 is present. In case of a metal-oxide-transistor (MOSFET), this gate will comprise a gate electrode 5 and a gate dielectric 6, but person skilled in the art will realize that other types of Field Effect Transistor (FET) structure can be used as selecting element 3. Similarly, at the drain side 12 a second gate 4 is present, which in case of a MOSFET will comprise a gate electrode 7 and a gate dielectric 8. In between this first 3 and second 4 gate an element 25 can be inserted, which is associated with the current Id flow between the source and drain under control of the first and second gate, when biased as disclosed in the third aspect of the invention. The current flow at the selected point 24 might influence or sense the operation or status of the element 25 in a direct or indirect way.

Figure 11D:
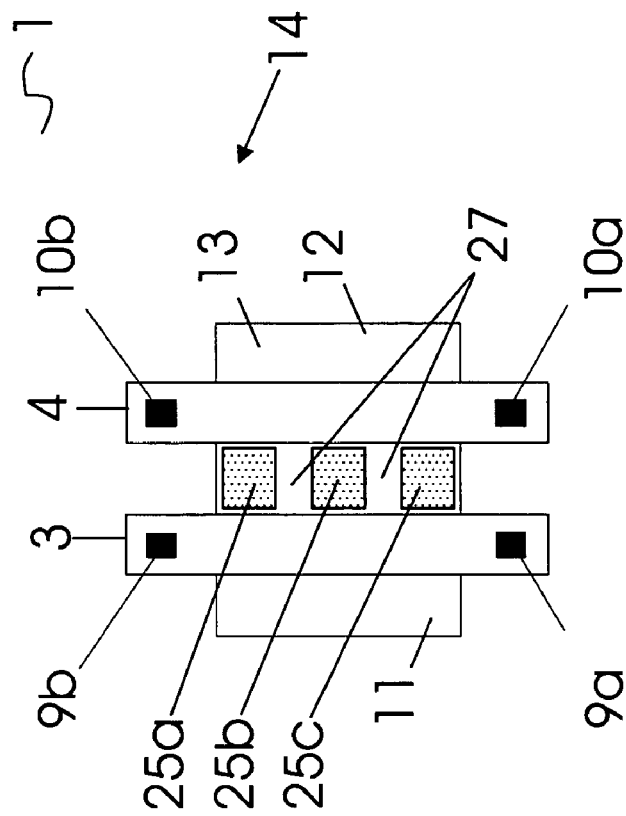
Figure 11C:
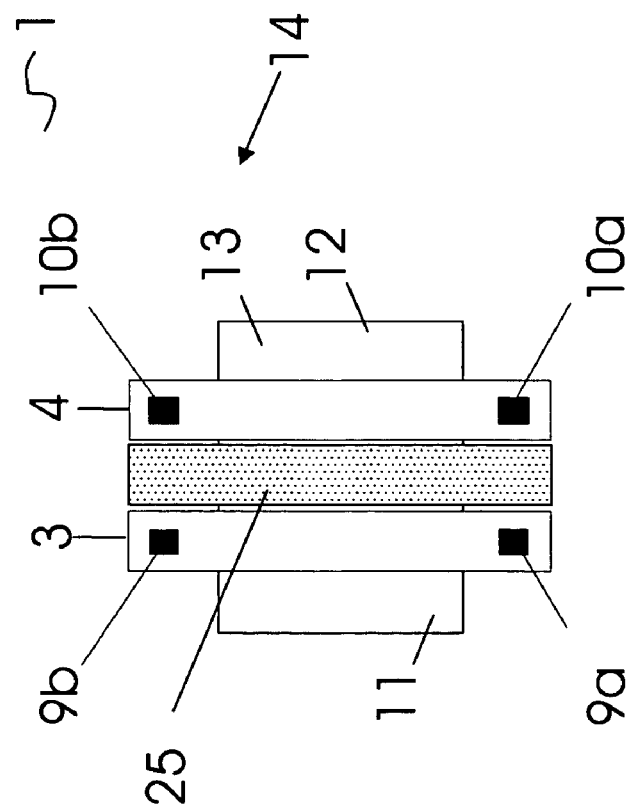

In FIG. 11b a charge trapping medium 25 is inserted in between the first and the second gate. Instead of injecting the charge into the charge storage layer of either the first and/or the second gate, as was the case in the preferred embodiment of the third aspect illustrated by FIG. 8, current Iinj is now injected into this trapping medium 25. The charge trapping medium can be formed as a continuous strip of material 25 extending along the width of the device, as shown in FIG. 11c, or it can be formed as a number of well-defined regions or as a sequence of individual elements (25a, 25b, 25c) placed adjacent to each other along the width of the device and separated from one another by an insulating material 27 such as oxide, as shown in FIG. 11d. This trapping medium can be nanocrystals such as polysilicon or metal dots embedded in an insulating layer such as oxide, high-k dielectrics such as Al2O3 or nitride. If the charge trapping medium is in the form of such well-defined mutually isolated regions (25a, 25b, 25c), the charge trapping medium can also be made of a conductor such as polysilicon or a metal.

In FIG. 11e the intermediate element 25 is a strip of a resistance-changing material formed in the substrate in between the first 3 and second gate 4. If a high current passes through such a resistance-changing material physical or structural changes occur within the material thereby changing its resistivity. This resistivity change can then afterwards be detected by the impact this resistivity change has on a sense current flowing through this intermediate element 25, the current level of this sense current being chosen to be sufficiently low in order not to change the resistivity of the intermediate element 25. This known effect is explored in memory devices, as the low and high resistivity state corresponds to respectively an unprogrammed and a programmed bit. By locally changing the resistance of this strip 25 of resistance-changing material, i.e. at the current bridge between the first and the second gate, a bit can be programmed at this selected position. By locally measuring the resistivity of the strip of resistance-change material, i.e. at the current bridge between the first and the second gate, the state of the bit can be detected. Several resistance-changing materials are known in the art, e.g. chalcogenide or perovskite materials. Ron Neale discloses in "Amorphous non-volatile memory: the past and the future" in Electronic Engineering, vol 73, no 891, pp 67-78, 2001 hereby incorporated by reference in its entirety the use of such phase-changing chalcogenide materials. The phase structure of this materials changes at higher current levels flowing through it and hence its resistivity will change accordingly.

In FIG. 11f an array of sensors 25 is placed as a sequence of intermediate element in-between the first gate 3 and the second gate 4. The sensing element 25 can also comprise a continuous structure extending along the width of the device. When a current Id is flowing the electromagnetic field, associated with this current flow, will be coupled to the sensor 25 located at the current bridge 24, as shown by the dashed double-headed arrow. This electromagnetic field can be detected by and trigger the operation of this sensor element or this field can in turn be influenced by the sensor element. This sensor element can be an optical device, a chemical or a magnetic sensor. The sensor element can be coupled to the current Id by modulating the conductivity of the semiconducting substrate below the sensor and in between the first 16 and the second 17 semiconductor regions. The conductivity modulation induced by the sensor element 25 can be detected locally at the position of the current bridge 24. This conductivity modulation can be caused by electromagnetic radiation, e.g. visible light, by creation of electron-hole pairs in the semiconductor substrate. The sensor element 25 can guide electromagnetic radiation originating from the environment to the semiconductor substrate, e.g. it can comprise a lens, an optical filter or a transparent medium such as oxide. The transparency of this medium can be modulated by physical quantities originating from the environment, e.g. the sensor element 25 can comprise liquid crystals that respond to an external electrostatic or magnetic field. The sensor element 25 can also change the wavelength of the electromagnetic radiation originating from the environment to a wavelength that is more suitable for the creation of electron-hole pairs in the substrate. For instance, the sensor element 25 can comprise a phosphorescent material. An alternative method to couple the current Id flowing in the semiconductor substrate to the sensor element is by means of an electrostatic field. For instance, external physical quantities can induce a charge or a charge dipole in the sensing element 25. This charge or charge dipole will create an electrostatic field which will then in turn modulate the conductivity in the substrate by the field-effect. Such external physical quantities can be chemical species or electromagnetic radiation. U.S. Pat. No. 6,521,109 discloses various ways of how such a chemical quantity can modify the operation of a field-effect-transistor, in a general way in the background section and in the description for a so-called CHEMFET. Bergveld, IEEE Transactions on Biomedical Engineering MD-17, 1970, pp. 70 discloses the concept of an ion-sensitive-field-effect transistor. Both references are hereby incorporated by reference. As an example of a device sensitive to electromagnetic radiation, the sensor 25 can comprise a photo-diode. Light falling into this photo-diode will generate a current which can be used to induce a net charge in vicinity of the semiconductor substrate. The element 25 can also be an actuating device, i.e. it can translate an electrical signal into a physical quantity propagating to the external environment. This electrical signal can be, or can be generated, controlled or triggered by the current Id flowing in the current bridge 24. The actuating element 25 could comprise a light emitting device. In this example the actuator 25 could be partly or entirely placed in-between the semiconductor structures 16 and 17, as shown in FIG. 11a, so that a current is flowing through the actuator 25 at the position of the current bridge 24.

Figure 12:
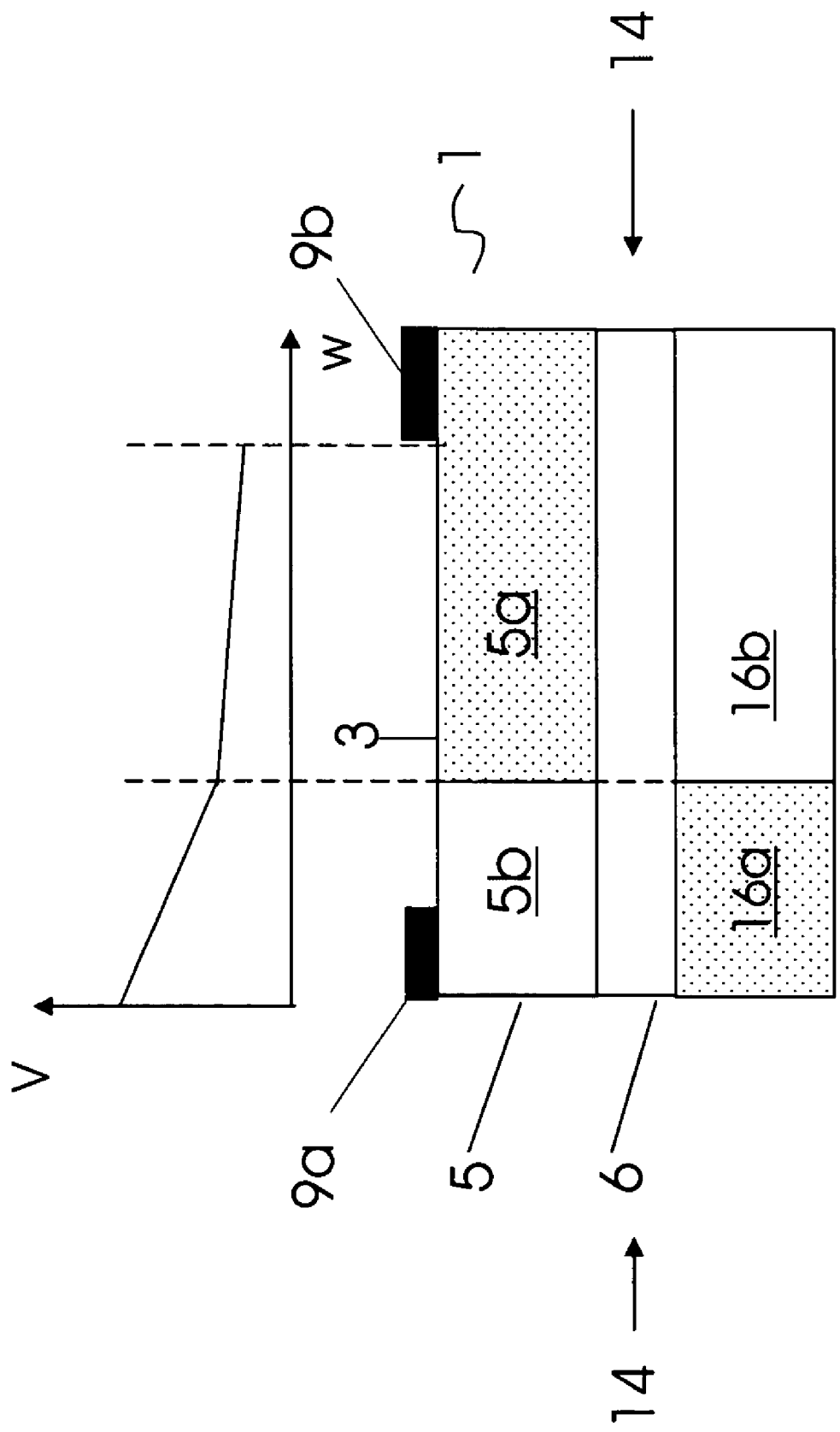
FIG. 12 shows a cross-section in longitudinal direction of a memory cell according to an embodiment of the invention, illustrating the effect of using lowly-doped polycrystalline silicon as gate electrode material

In the previous embodiments of the invention, not much has been the about the materials choice of the first 5 and second gate 7 electrode. However the choice of electrode material(s) also determines the electrical field distribution in the gate electrode 5, 7 in longitudinal direction and the conductivity gradient induced by this electrical field in the corresponding substrate region 16, 17. In the paragraphs below this choice will be discussed in more detail for the first gate 3, however the application of this teaching can also be applied to the other gate 4. In standard semiconductor process technology polycrystalline silicon would be a first choice for the electrode material. This material can be easily integrated in a semiconductor device while its resistivity can be modulated by selecting an appropriate implantation species and dose. Whereas moderately or highly doped polycrystalline silicon offer a homogenous resistivity and voltage drop over the gate, lowly doped silicon exhibits depletion and or accumulation effects. This is illustrated in FIG. 12. A voltage drop is applied to contacts 9a, 9b of the first gate 3 (with gate electrode 5). For the purpose of teaching, an n-doped polycrystalline silicon is used as gate electrode, while the substrate region 16 is p-doped, e.g. a p-well region formed in a semiconductor substrate. At these points 5b where the potential of the gate electrode 5 is sufficiently positive with respect to the underlying semiconductor region 16, i.e. above the threshold potential, this semiconductor region 16a will be inverted. This is illustrated in FIG. 7. However, due to the low dopant concentrations the gate electrode will become depleted resulting in a change of the resistivity of this part 5b of the gate electrode. Likewise, in these points 5a where the potential of the gate electrode 5 is below the threshold potential of the corresponding semiconductor region 16b, this semiconductor region 16b will be depleted or even in the accumulation state. Due to the low dopant concentration, the corresponding gate electrode region 5a will become inverted, resulting in a change of resistivity. By using lowly doped polycrystalline silicon as gate material one obtains a steep voltage gradient over the depleted part 5b and a smaller voltage gradient over the higher conductive inverted part 5a as shown in the voltage-longitudinal position (V-x) curve of FIG. 12.

Figure 13:
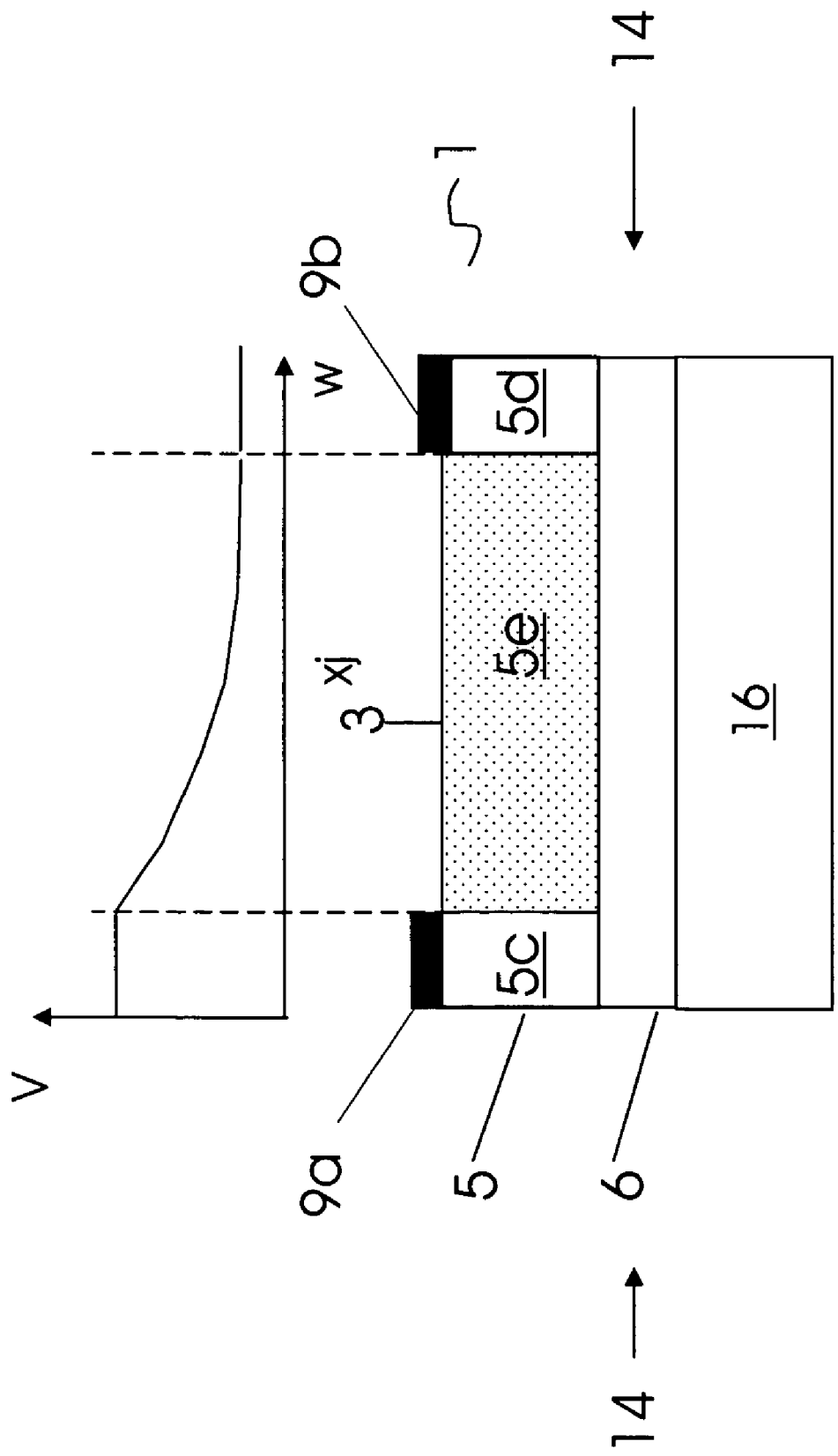
FIG. 13 shows a cross-section in longitudinal direction of a memory cell according to an embodiment of the invention, illustrating the effect of using a PIN device as gate electrode

Lowly doped polysilicon is an example of a material whereby its resistivity depends on the voltage applied to it. Such voltage-controlled-resistors (VCR) can thus be used to transform the voltage difference applied over the gate electrode into a non-linear electrical field distribution and, preferably, result in a sharper voltage drop at particular locations along the longitudinal direction thereby reducing the width of the overlap region 24. Using polycrystalline as gate electrode material would also allow the formation a so-called PIN diode in the gate electrode. The operation of such a PIN device is explained by Sze in "Physics of semiconductor devices", 1981 Wiley & Sons, p. 117 to p. 122, hereby incorporated by reference in its entirety. This is illustrated in FIG. 13. As is known in the art a depletion region is created between a p-type doped and n-type semiconductor region. In FIG. 13 the gate electrode is constructed from a p-doped region 5c, in this example located near the contact region 9a, and a n-doped region 5d located near the contact region 9b. Both regions are separated by an undoped or intrinsic semiconductor region 5e. Thus undoped semiconductor region 5e can also be formed by a high resistive n-type or p-type doped region. A PIN structure is thus created by combination of p-type doped region 5c, undoped region 5e and n-type doped region 5d. As is known in the art, see e.g Sze in "Physics of semiconductor devices" the depletion region of such PIN structure will be located within the undoped region 5e. For a given PIN structure the voltage between both contacts 9a and 9b will vary in a non-linear way as illustrated by the voltage V-longitudinal position W-curve of FIG. 13. Also the resistivity of the depletion layer formed within region 5e will depend on the voltage applied over the PIN diode as shown in FIG. 41, p 119 of the Sze reference.

Instead of using semiconductor materials, such as silicon, silicon germanium, germanium, one can use low conductive or high resistive materials such as TaN. Using material(s) with a high resistivity reduces the current flow through the gate electrode when applying the voltage difference thereover, resulting in a decreased power consumption during operation.

Instead of using a single material to form the gate electrode 5 one can use a layered stack of materials with different resistivity properties. One can combine TaN with lowly doped polysilicon.

Figure 14:
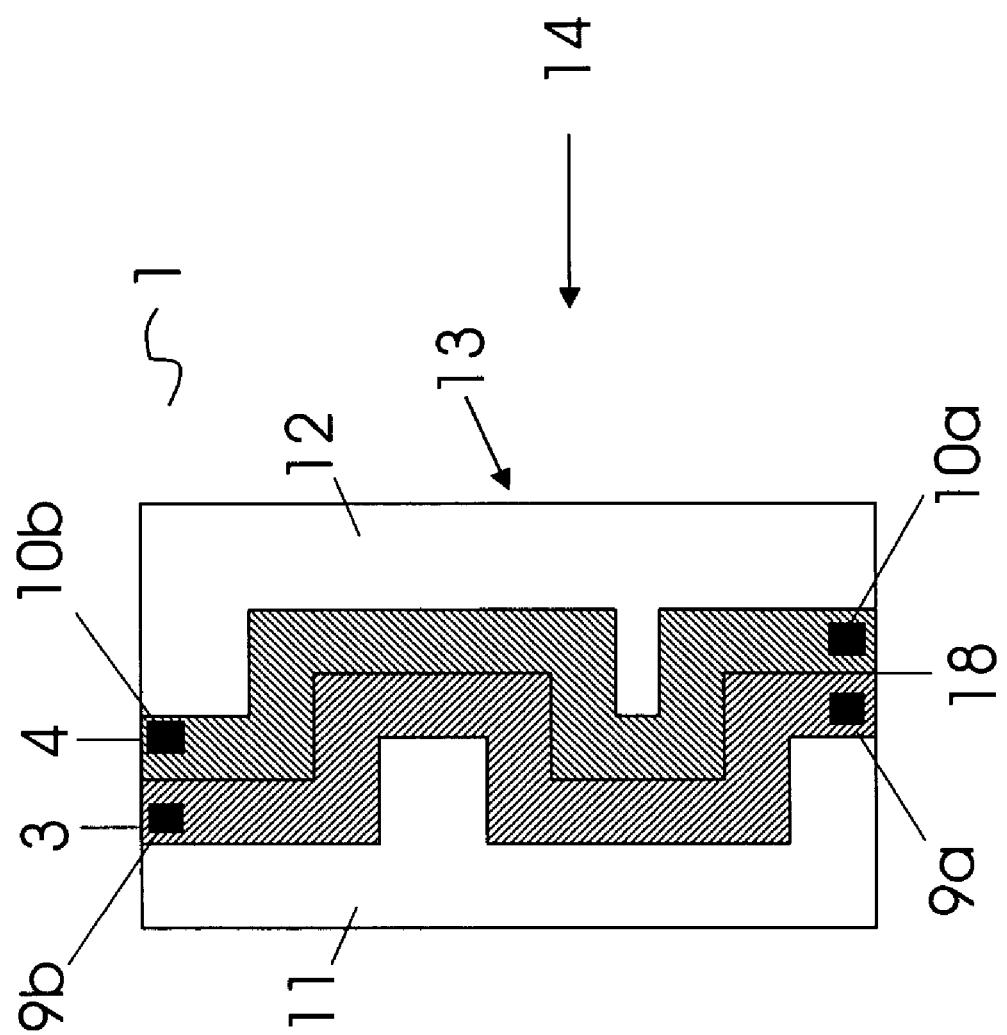
FIG. 14 shows one alternative layout of a memory cell according to an embodiment of the invention.

The number of distinct overlap regions 24 can also be increased by optimizing the layout of the device 1. In FIG. 2a, a device 1 is shown having the interface between the two substrate regions 16, 17 run in one particular direction. FIG. 14 shows an alternative layout for the device 1. The device 1 is designed as a serpentine structure. Other layouts allowing an increase of the length of the interface, for given dimensions of the active area 13, are known in the art.

Figure 15:
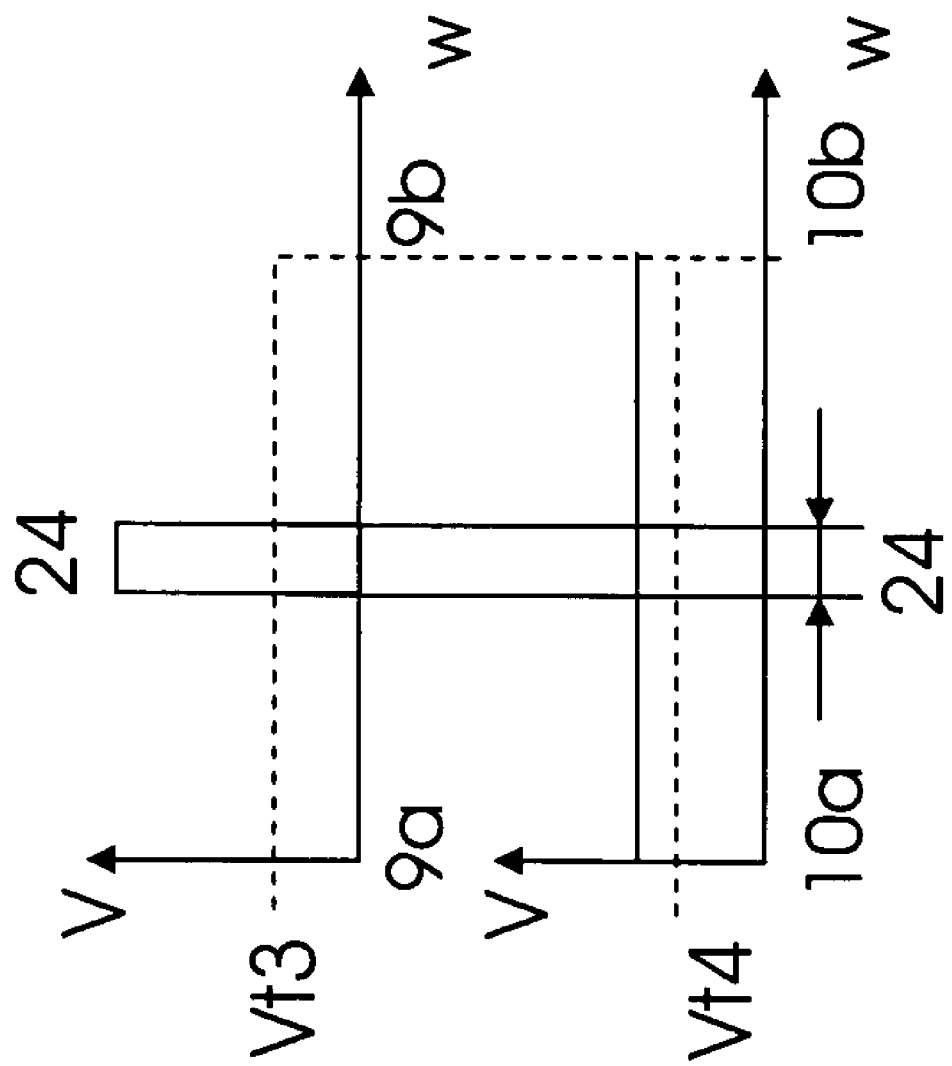
FIG. 15 shows a voltage-biasing scheme according to an embodiment of the invention.

FIG. 15 illustrates an alternative-biasing scheme compared to FIG. 7. A shown in FIG. 7 in both gate electrodes 5, 7 the voltage drops linearly with the position w in longitudinal direction W resulting in a similar monotonic conductivity change in the corresponding substrate regions 16, 17. Only in the overlap region 24 the inversion region 16a, 17a of both semiconductor regions coincide thereby allowing the current to flow from the first contact region 11 to the second contact region 12 through this overlap region 24. Hence as a result of this biasing scheme a non-monotonic current flow is generated from the first contact region 11 towards the second contact region 12 through the interface between the semiconductor regions 16 and 17. The same confined current flow between first 11 and second 12 contact region can be obtained by applying a biasing scheme as illustrated in FIG. 15. One gate electrode, e.g. 4, can be biased to a constant voltage above the threshold voltage Vt4 of the second gate 4 such that an inversion region is created underneath this gate electrode 4 over the complete semiconductor region 17. On the other gate electrode, e.g. 3, only a voltage is applied at the selected region 24. As in the other regions of the gate electrode 3 no voltage is applied, or at least no voltage above the threshold voltage of the first gate 3, no inversion region is created in the corresponding parts of the semiconductor region 16 and a non-monotonic conductivity change is created in semiconductor region 16 resulting again in a non-monotonic or peak current from the first contact region to the second contact region through the interface between both semiconductor regions 16, 17. Hence current can only flow within the inverted region 16a underneath the voltage pulse applied at the first electrode 5 towards the second gate 4. The combination of the biasing of gate electrode 5 and gate electrode 7 thus results in a current flow between both contact regions 11, 12 at a predetermined position 24.

Figure 16:
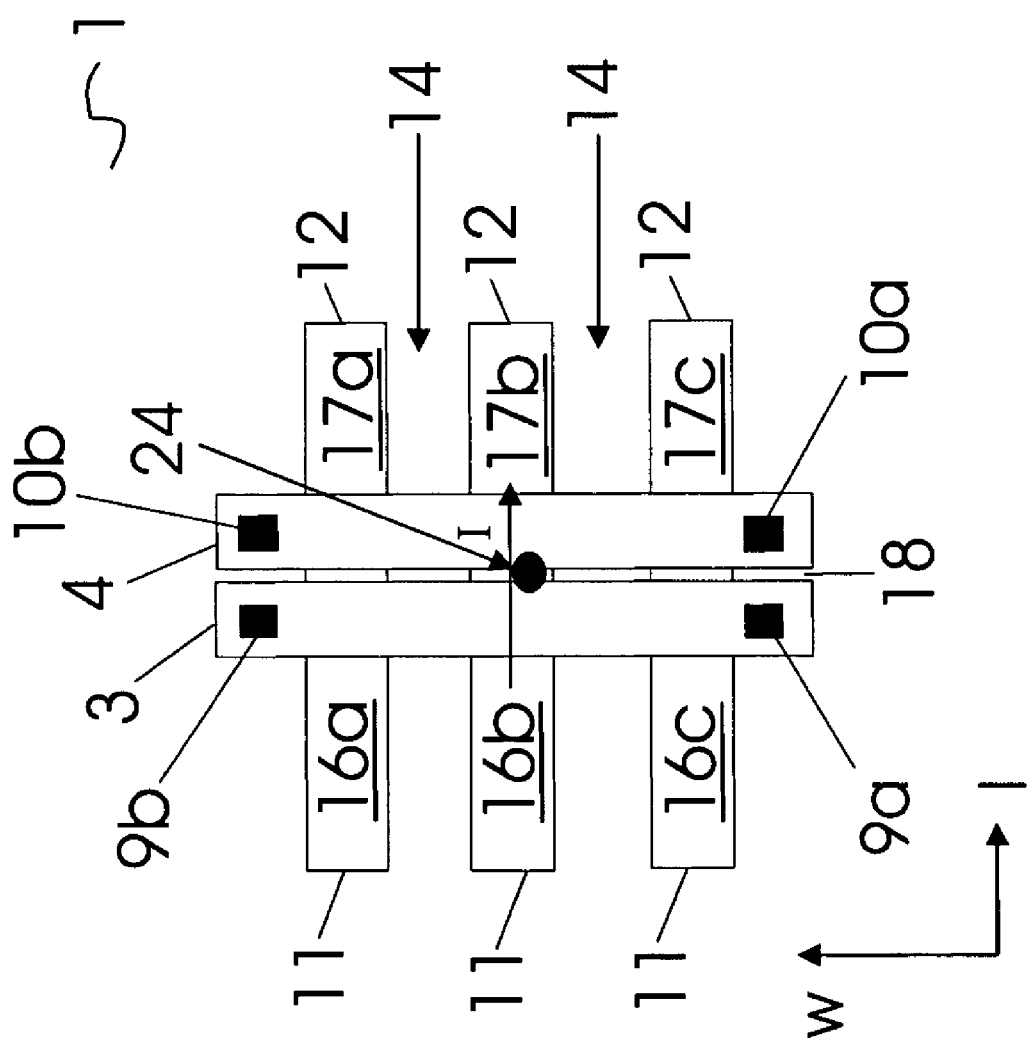
FIG. 16 shows a device comprising a sequence of semiconductor elements according to an embodiment of the invention.

In the previous embodiments of the invention the semiconductor regions 16, 17 were assumed to be continuous semiconductor regions. As illustrated by FIG. 1 and FIG. 2a typically a semiconductor substrate 2, e.g. silicon, is used as a starting substrate. FIG. 1 can be viewed as a cross-section 2-2 of FIG. 2a in length direction i.e. along the L-axis. In this substrate 2 the semiconductor regions 16, 17 can be formed. For example starting from a p-type doped substrate one can form by e.g. ion implantation p-well semiconductor regions in case riMOS Field Effect Transistor (FET)-devices are to be manufactured or n-well semiconductor regions in case pMOS FET devices are to be created upon this substrate. In either case the semiconductor regions 16, 17 are isotropic and continuous at least in longitudinal direction W. However the invention is not limited to such continuous semiconductor regions 16, 17. As illustrated in FIG. 16 the semiconductor regions 16, 17 or at least one of them can be formed as a sequence of semiconducting elements 16a-17a, 16b-17b, 16c-17c which are electrically insulated from each other. In FIG. 16 the active area 13 of FIG. 2a is replaced by strips of semiconducting regions 16a-17a, 16b-17b, 16c-17c. Each strip will have a first contact region 11, e.g. source, and a second contact region 12, e.g. drain, and a semiconducting region, respectively 16a-17a, 16b-17b, 16c-17c extending from the one contact region 11 to the other contact region 12 to form a channel region in-between. These individual semiconducting regions 16a-17a, 16b-17b, 16c-17c are electrically insulated 14 from each other and each pair of semiconductor elements form a semiconductor region overlapped by both gate structures 3, 4.

One way of forming such a sequence of individual semiconductor regions 16a-17a, 16b-17b, 16c-17c is to form parallel active area regions 13 in a semiconductor substrate 1, these active area regions being insulated by a dielectric 14. In a direction substantially perpendicular to these semiconducting strips the gate structures 3 and 4 are created overlapping all these semiconducting strips. Instead of forming individual regions 16a-17a, 16b-17b, 16c-17c in a semiconducting substrate 2, one can form semiconducting strips 16a-17a, 16b-17b, 16c-17c upon a substrate 2, which should preferably be an insulating substrate. This semiconducting strip 16a-17a, 16b-17b, 16c-17c can be the fin (17) of a FinFET device as disclosed in European application EP 1 383 166. In this teaching the fin (17) is a silicon strip formed in a silicon layer (2) upon the oxide layer (3) of an SOI substrate (1). This semiconducting strip 16a-17a, 16b-17b, 16c-17c can be a semiconductive polymer, e.g. an organic polymer such as a carbon nanotubes, deposited on a non-conductive substrate 2. Such carbon nanotubes are known in the art. R. Baughman et al discusses in "Carbon nanotubes—the route toward applications", SCIENCE VOL 297, 2 Aug. 2002 the formation and the application of such carbon nanotubes. In this example semiconductive polymers are used to form the semiconducting strips 16a-17a, 16b-17b, 16c-17c.

Figure 17:
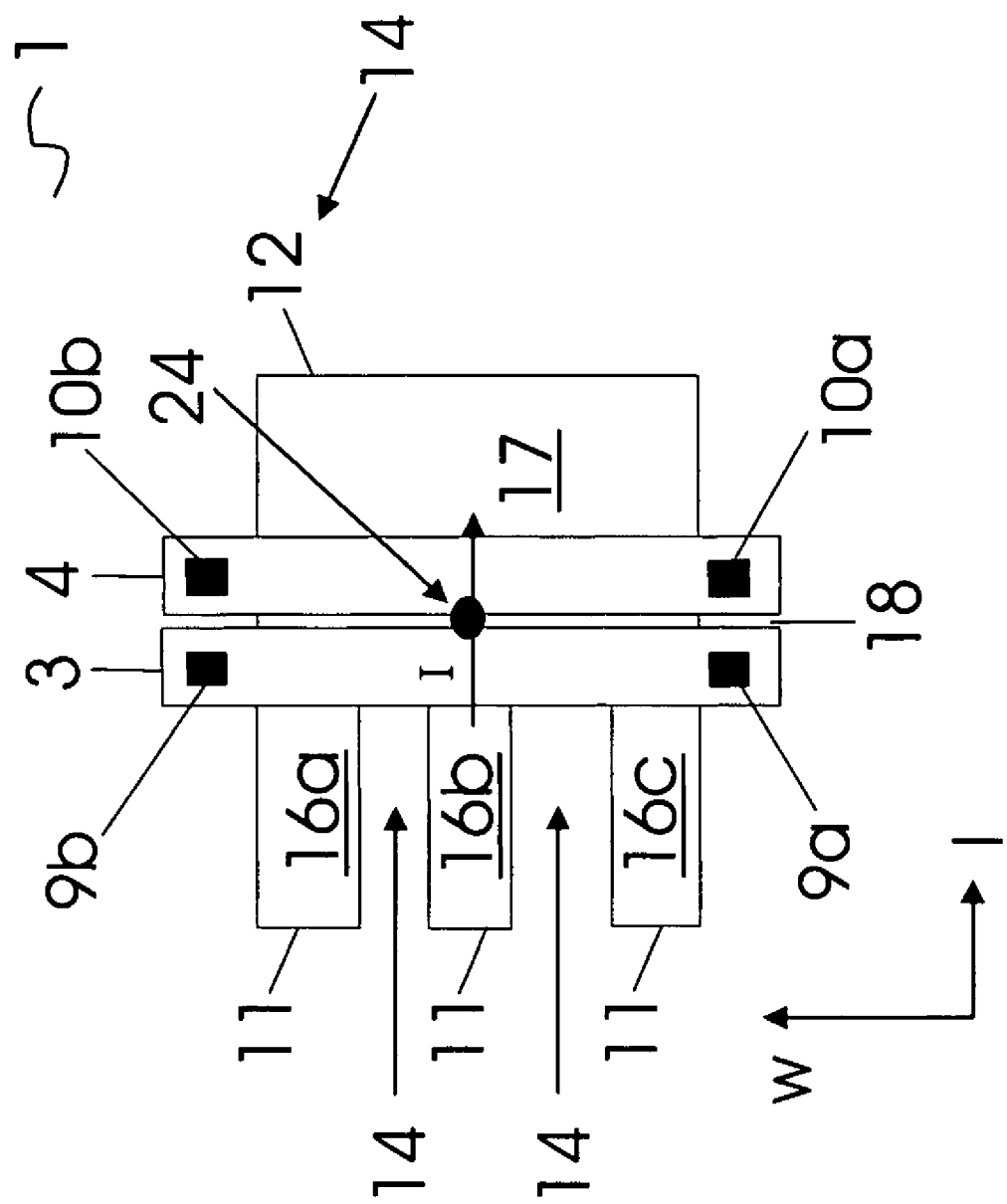
FIG. 17 shows a device comprising a sequence of semiconductor elements according to another embodiment of the invention.

The device illustrated in FIG. 16 does generally operate in a way similar to the device illustrated in FIG. 2a. As indicated by the arrows, current I will flow from one contact region 11 to another contact region 12 at a predetermined point 24 along the interface between the corresponding semiconducting regions 16a-17a, 16b-17b, 16c-17c. The difference in operation of the device of FIG. 16 compared to the device of FIG. 2a is that not every point 24 in longitudinal direction can be selected, but only points that lie within such a semiconductor strip 16a-17a, 16b-17b, 16c-17c. In the example illustrated by FIG. 16 the electrical field distribution in gate 3 and 4 is selected such that both semiconducting regions 16b-17b are conducting thereby forming a conductive path between the corresponding contact regions 11 and 12. In the other pair of semiconducting regions 16a-17a, 16c-17c at least one of these semiconducting regions is biased in a non-conductive state, e.g. depletion. Optionally both regions can be biased in a conductive state but with inverse polarity, i.e. conduction is based on transport of charge carriers of an opposite conductivity type. In the latter biasing scheme semiconducting region 16a might be biased into inversion with electrons as carriers, while corresponding semiconducting region 17a is biased into accumulation with holes as carriers. Consequently an energy barrier is created at the interface between both semiconducting regions 16a, 17a blocking the flow of carriers from one contact region 11 to the other contact region 12. FIG. 17 illustrates another alternative structure. Here only the semiconductor region 16 underneath the first gate 3 is constructed as a sequence of semiconductor elements 16a, 16b, 16c, each element having its own contact region 11 while the semiconductor region 17 underneath the second gate is formed as a continuous region extending along the longitudinal direction. Please not that the gate structures 3, 4 are still continuous in longitudinal direction in all embodiments discussed.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A semiconductor device, comprising:
    a first semiconductor modulator formed on a first semiconductor region, wherein the first semiconductor modulator extends across the first semiconductor region, wherein the first semiconductor modulator is configured to modulate the conductivity of the first semiconductor region;
    a second semiconductor modulator formed on a second semiconductor region, wherein the second semiconductor modulator is configured to modulate the conductivity of the second semiconductor region,
    wherein the first and second modulators are configured to select a path by which current flows from a modulated portion of the first semiconductor region to a modulated portion of the second semiconductor region,
    wherein the conductivity of the first semiconductor region varies along the first semiconductor modulator.

2. The device of claim 1, wherein the first and second modulators are adapted to cause gradients in the conductivity in the semiconductor regions, and wherein the conductivity gradients are opposed to each other, so that if there is a continuous rise in conductivity in one gradient along a given direction, there is a continuous fall in conductivity in the other gradient along the same direction.

3. The device of claim 1, further comprising at least one dielectric layer, which includes a charge storage layer.

4. The device of claim 3, wherein the charge storage layer comprises silicon-nitride.

5. The device of claim 3, wherein the charge storage layer includes discrete regions of material suitable for storing a charge thereon.

6. The device of claim 1, wherein the semiconductor regions are formed as a continuous region in a substrate.

7. The device of claim 1, wherein the first modulator is further configured to modulate the conductivity of the first semiconductor region according to a voltage gradient across the first modulator.

8. The device of claim 1, wherein the second semiconductor modulator extends across the second semiconductor region.

9. The device of claim 1, wherein at least one of the first and second semiconductor modulators comprises a gate.

10. The device of claim 1, wherein the current which flows from the modulated portion of the first semiconductor region to the modulated portion of the second semiconductor region flows underneath the first current modulator regardless of the path selected for current flow.

11. A method of operating of a semiconductor device, the method comprising:
    modulating the conductivity of a portion of a first semiconductor region, wherein the portion of the first semiconductor region extends across the first semiconductor region;
    modulating the conductivity of a second semiconductor region,
    wherein modulating the conductivity of the first and second semiconductor regions comprises selecting a path by which current flows from a modulated portion of the first semiconductor region to a modulated portion of the second semiconductor region and comprises varying the conductivity of the first semiconductor region along the first semiconductor modulator.

12. The method of claim 11, wherein the first semiconductor region is in electrical contact with a first contact region and the second semiconductor region is in electrical contact with a second contact region, and the first semiconductor region and the second semiconductor region are in electrical contact with each other.

13. The method of claim 12, wherein a gradient in conductivity is created by both semiconductor modulators, the conductivity gradients being opposed to each other, so that if there is a continuous rise in conductivity in one gradient along a given direction, there is a continuous fall in conductivity in the other gradient along the same direction.

14. A semiconductor device, comprising:
means for modulating the conductivity of a portion of a first semiconductor region, wherein the portion of the first semiconductor region extends across the first semiconductor region;
means for modulating the conductivity of a second semiconductor region,
wherein modulating the conductivity of the first and second semiconductor regions comprises selecting a path by which current flows from a modulated portion of the first semiconductor region to a modulated portion of the second semiconductor region,
wherein the conductivity of the first semiconductor region varies along the first semiconductor modulator.

15. The device of claim 14, wherein the first and second modulating means are configured to cause gradients in the conductivity in the semiconductor regions, and wherein the conductivity gradients are opposed to each other, so that if there is a continuous rise in conductivity in one gradient along a given direction, there is a continuous fall in conductivity in the other gradient along the same direction.

16. The device of claim 14, wherein the semiconductor regions are formed as a continuous region in a substrate.

17. A semiconductor device, comprising:
a semiconductor area;
first and second semiconductor modulators crossing the semiconductor area, wherein the first and second semiconductor modulators are each configured to modulate the conductivity of the semiconductor area beneath the first and second semiconductor modulators, respectively, so as to select a path for current to flow from the active area beneath the first and semiconductor modulator to the active area beneath second semiconductor modulator,
wherein the conductivity of the first semiconductor region varies along the first semiconductor modulator.

18. The device of claim 17, wherein the first and second modulators are adapted to cause gradients in the conductivity in the semiconductor regions, and wherein the conductivity gradients are opposed to each other, so that if there is a continuous rise in conductivity in one gradient along a given direction, there is a continuous fall in conductivity in the other gradient along the same direction.

19. The device of claim 17, further comprising at least one dielectric layer, which includes a charge storage layer.

20. The device of claim 19, wherein the charge storage layer comprises silicon-nitride.

21. The device of claim 19, wherein the charge storage layer includes discrete regions of material suitable for storing a charge thereon.

22. The device of claim 17, wherein the second semiconductor modulator extends across the second semiconductor region.

23. The device of claim 17, wherein at least one of the first and second semiconductor modulators comprises a gate.

24. The device of claim 17, wherein the current which flows from the modulated portion of the first semiconductor region to the modulated portion of the second semiconductor region flows underneath the first current modulator regardless of the path selected for current flow.

25. A semiconductor device, comprising:
a first semiconductor modulator formed on a first semiconductor region, wherein the first semiconductor modulator extends across the first semiconductor region, wherein the first semiconductor modulator is configured to modulate the conductivity of the first semiconductor region;
a second semiconductor modulator formed on a second semiconductor region, wherein the second semiconductor modulator is configured to modulate the conductivity of the second semiconductor region,
wherein the first and second modulators are configured to select a path by which current flows from a modulated portion of the first semiconductor region to a modulated portion of the second semiconductor region,
wherein the first semiconductor region is in electrical contact with a first contact region and the second semiconductor region is in electrical contact with a second contact region, and wherein the first and second contact regions form a source and a drain, and wherein the semiconductor modulators form channel regions between the source and drain, the device comprising at least two gate electrodes, which are electrically insulated from each other, each gate electrode being dielectrically coupled to one of the channel regions, and wherein each of the gate electrodes is provided with two contacts, arranged in such a way as to allow the application of two different voltage levels to the contacts, to thereby create a voltage gradient in the gate electrode.

26. The device of claim 25, wherein the gate electrodes are elongated in shape, and wherein the contacts are provided near either end of the at least two gate electrodes.

27. The device of claim 26, wherein the gate electrodes are placed adjacent to each other, and spaced apart by an insulation layer.

28. The device of claim 26, wherein the gate electrodes are placed with an intermediate element placed in between.

29. The device of claim 28, wherein the intermediate element is a sensing/actuating element, a trapping medium, such as nanocrystals, or a strip of resistance-changing material.

30. The device of claim 25, wherein at least one of the gate electrodes is made of lowly doped silicon.

31. The device of claim 25, wherein at least one of the gate electrodes is a PIN diode.

32. The device of claim 25, wherein at least one of the gate electrodes is made of TaN.

33. The device of claim 25, wherein at least one of the gate electrodes is formed as a stack of materials.

34. A semiconductor device, comprising:
a first semiconductor modulator formed on a first semiconductor region, wherein the first semiconductor modulator extends across the first semiconductor region, wherein the first semiconductor modulator is configured to modulate the conductivity of the first semiconductor region;
a second semiconductor modulator formed on a second semiconductor region, wherein the second semiconductor modulator is configured to modulate the conductivity of the second semiconductor region, wherein the first and second modulators are configured to select a path by which current flows from a modulated portion of the first semiconductor region to a modulated portion of the second semiconductor region, wherein the selected path is selected from a plurality of paths formed as a sequence of semiconductor elements, which are electrically insulated from each other.

35. The device of claim 34, wherein the semiconductor elements are semiconductor regions formed in a substrate.

36. The device of claim 34, wherein the semiconductor elements are semiconductor carbon nanotubes formed upon a substrate.

37. The device of claim 34, further comprising at least one dielectric layer, which includes a charge storage layer.

38. The device of claim 37, wherein the charge storage layer comprises silicon-nitride.

39. The device of claim 37, wherein the charge storage layer includes discrete regions of material suitable for storing a charge thereon.

40. A semiconductor device, comprising:
a first semiconductor modulator formed on a first semiconductor region, wherein the first semiconductor modulator extends across the first semiconductor region, wherein the first semiconductor modulator is configured to modulate the conductivity of the first semiconductor region;
a second semiconductor modulator formed on a second semiconductor region, wherein the second semiconductor modulator is configured to modulate the conductivity of the second semiconductor region,
wherein the first and second modulators are configured to select a path by which current flows from a modulated portion of the first semiconductor region to a modulated portion of the second semiconductor region,
wherein the first semiconductor modulator comprises electrodes configured to establish a voltage gradient in the first semiconductor modulator.

41. The device of claim 40, wherein the first and second modulators are adapted to cause gradients in the conductivity in the semiconductor regions, and wherein the conductivity gradients are opposed to each other, so that if there is a continuous rise in conductivity in one gradient along a given direction, there is a continuous fall in conductivity in the other gradient along the same direction.

42. The device of claim 40, further comprising at least one dielectric layer, which includes a charge storage layer.

43. The device of claim 42, wherein the charge storage layer comprises silicon-nitride.

44. The device of claim 42, wherein the charge storage layer includes discrete regions of material suitable for storing a charge thereon.

45. The device of claim 40, wherein the semiconductor regions are formed as a continuous region in a substrate.

46. The device of claim 40, wherein the first modulator is further configured to modulate the conductivity of the first semiconductor region according to a voltage gradient across the first modulator.

47. A semiconductor device, comprising:
means for modulating the conductivity of a portion of a first semiconductor region, wherein the portion of the first semiconductor region extends across the first semiconductor region;
means for modulating the conductivity of a second semiconductor region,
wherein modulating the conductivity of the first and second semiconductor regions comprises selecting a path by which current flows from a modulated portion of the first semiconductor region to a modulated portion of the second semiconductor region,
wherein the means for modulating the conductivity of the portion of the first semiconductor region comprises means for generating a voltage gradient in the means for modulating the conductivity of the portion of the first semiconductor region.

48. The device of claim 47, wherein the first and second modulating means are configured to cause gradients in the conductivity in the semiconductor regions, and wherein the conductivity gradients are opposed to each other, so that if there is a continuous rise in conductivity in one gradient along a given direction, there is a continuous fall in conductivity in the other gradient along the same direction.

49. The device of claim 47, wherein the semiconductor regions are formed as a continuous region in a substrate.

50. The device of claim 47, wherein the first modulating means is further configured to modulate the conductivity of the first semiconductor region according to the voltage gradient across the first modulator.

51. A semiconductor device, comprising:
a semiconductor area;
first and second semiconductor modulators crossing the semiconductor area, wherein the first and second semiconductor modulators are each configured to modulate the conductivity of the semiconductor area beneath the first and second semiconductor modulators, respectively, so as to select a path for current to flow from the active area beneath the first and semiconductor modulator to the active area beneath second semiconductor modulator,
wherein the first semiconductor modulator comprises electrodes configured to establish a voltage gradient in the first semiconductor modulator.

52. The device of claim 51, wherein the first and second modulators are adapted to cause gradients in the conductivity in the semiconductor regions, and wherein the conductivity gradients are opposed to each other, so that if there is a continuous rise in conductivity in one gradient along a given direction, there is a continuous fall in conductivity in the other gradient along the same direction.

53. The device of claim 51, further comprising at least one dielectric layer, which includes a charge storage layer.

54. The device of claim 53, wherein the charge storage layer comprises silicon- nitride.

55. The device of claim 53, wherein the charge storage layer includes discrete regions of material suitable for storing a charge thereon.

56. The device of claim 51, wherein the semiconductor regions are formed as a continuous region in a substrate.

57. The device of claim 51, wherein the first modulator is further configured to modulate the conductivity of the first semiconductor region according to a voltage gradient across the first modulator.

* * * * *

UNITED STATES PATENT AND TRADEMARK OFFICE
CERTIFICATE OF CORRECTION

PATENT NO. : 7,569,882 B2  Page 1 of 1
APPLICATION NO. : 11/019953
DATED : August 4, 2009
INVENTOR(S) : Maarten Rosmeulen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 100 days.

Signed and Sealed this

Seventh Day of September, 2010

David J. Kappos
*Director of the United States Patent and Trademark Office*